(12) United States Patent
Lim et al.

(10) Patent No.: US 9,509,308 B2
(45) Date of Patent: Nov. 29, 2016

(54) SUPPLY-MODULATION CROSS DOMAIN DATA INTERFACE

(71) Applicant: SYNAPTICS INCORPORATED, San Jose, CA (US)

(72) Inventors: Shao-Jen Lim, San Jose, CA (US); Prashant Shamarao, Cupertino, CA (US)

(73) Assignee: Synaptics Incorporated, San Jose, CA (US)

( * ) Notice: Subject to any disclaimer, the term of this patent is extended or adjusted under 35 U.S.C. 154(b) by 130 days.

(21) Appl. No.: 14/502,785

(22) Filed: Sep. 30, 2014

(65) Prior Publication Data

US 2016/0094225 A1    Mar. 31, 2016

(51) Int. Cl.
| | | |
|---|---|---|
| H03L 5/00 | (2006.01) |
| H03K 19/0175 | (2006.01) |
| H03K 5/02 | (2006.01) |
| G06F 3/044 | (2006.01) |
| G06F 3/041 | (2006.01) |

(52) U.S. Cl.
CPC ....... *H03K 19/017509* (2013.01); *G06F 3/044* (2013.01); *G06F 3/0416* (2013.01); *H03K 5/02* (2013.01); *G06F 2203/04103* (2013.01)

(58) Field of Classification Search
None
See application file for complete search history.

(56) References Cited

U.S. PATENT DOCUMENTS

| | | | |
|---|---|---|---|
| 6,373,909 B2 | 4/2002 | Lindquist et al. | |
| 6,600,338 B1 * | 7/2003 | Nguyen | H03K 19/018528 326/68 |
| 6,781,534 B2 | 8/2004 | Karlquist | |
| 6,831,491 B2 | 12/2004 | Karlquist | |
| 7,227,400 B1 * | 6/2007 | Gillespie | H03K 19/00315 327/333 |
| 7,629,830 B1 * | 12/2009 | Rubin | H03K 3/021 326/63 |
| 8,639,115 B2 | 1/2014 | Mazed | |
| 9,124,279 B2 * | 9/2015 | Dai | H03H 11/481 |
| 2007/0077068 A1 | 4/2007 | Mazed | |
| 2010/0102851 A1 * | 4/2010 | Muha | H03K 3/356034 326/81 |
| 2010/0148818 A1 * | 6/2010 | Deutscher | H03K 19/0016 326/34 |
| 2011/0037509 A1 * | 2/2011 | Herzer | H03K 19/018521 327/333 |
| 2011/0095804 A1 * | 4/2011 | Kumar | H03K 19/018521 327/333 |
| 2015/0180474 A1 * | 6/2015 | Mathur | H03K 19/0175 326/81 |
| 2015/0280714 A1 * | 10/2015 | Kumar | H03K 19/0185 327/333 |
| 2015/0381180 A1 * | 12/2015 | Tsuji | H03K 19/018521 327/319 |

FOREIGN PATENT DOCUMENTS

DE    19633013 A1    2/1998

* cited by examiner

*Primary Examiner* — Lincoln Donovan
*Assistant Examiner* — Khareem E Almo
(74) *Attorney, Agent, or Firm* — Patterson + Sheridan, LLP

(57) ABSTRACT

A method for converting data signals from one power supply voltage domain for use in another power supply voltage domain. The method includes receiving the data signal at a first node of the integrated circuit, wherein the first node is within the first power supply voltage domain. The method also includes generating a first intermediate differential signal from the data signal via a first conversion circuit of the integrated circuit. The method further includes communicating the first intermediate differential signal to a first cross-coupled latch, wherein the first cross-coupled latch generates a first output signal based on the first intermediate differential signal. The method also includes outputting the first output signal from a second node of the integrated circuit, wherein the second node is in the second power supply voltage domain. Other embodiments, such as an integrated circuit, and an input device, are also provided.

30 Claims, 8 Drawing Sheets

SUPPLY-MODULATION CROSS DOMAIN DATA INTERFACE

BACKGROUND OF THE INVENTION

1. Field of the Invention

Embodiments of the present invention generally relate to a method and apparatus for converting data for use in different power supply voltage domain, and more specifically, to a supply-modulation cross-domain data interface.

2. Description of the Related Art

Input devices including proximity sensor devices (also commonly called touchpads or touch sensor devices) are widely used in a variety of electronic systems. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones). A proximity sensor device typically includes sensor electrodes that are driven with signals for capacitive sensing.

Some proximity sensor devices are included in display devices that include display electrodes for updating display elements. In order to guard the sensor electrodes from the display electrodes, the sensor electrodes and display electrodes may be powered by a modulated power supply that is modulated with respect to a system ground. In such an input device, some components are coupled to the modulated power supply, while other components may not be coupled to the modulated power supply. Because the power supply voltages differ, data signals from a component that is coupled to the modulated power supply may not be compatible with a component that is not coupled to the modulated power supply.

As the foregoing illustrates, what is needed in the art are techniques for transmitting data signals from a component that is not coupled to a modulated power supply to a component that is coupled to the modulated power supply.

SUMMARY

One embodiment of the present disclosure includes a method for communicating a data signal within an integrated circuit of a processing system having a first power supply voltage domain and a second power supply voltage domain, wherein at least one of a positive power supply voltage of the second power supply voltage domain and a negative power supply voltage of the second power supply voltage domain are modulated with respect to the first power supply voltage domain. The method includes receiving the data signal at a first node of the integrated circuit, wherein the first node is within the first power supply voltage domain. The method also includes generating a first intermediate differential signal from the data signal via a first conversion circuit of the integrated circuit. The method further includes communicating the first intermediate differential signal to a first cross-coupled latch, wherein the first cross-coupled latch generates a first output signal based on the first intermediate differential signal. The method also includes outputting the first output signal from a second node of the integrated circuit, wherein the second node is in the second power supply voltage domain.

Another embodiment of the present disclosure includes an integrated circuit. The integrated circuit includes a first power supply voltage domain, a second power supply voltage domain, and a cross-domain interface circuit. A positive power supply voltage of the second power supply voltage domain and a negative power supply voltage of the second power supply voltage domain are modulated with respect to the first power supply voltage domain. The cross-domain interface circuit includes a first conversion circuit that includes a first node and that is within the first power supply voltage domain. The cross-domain interface circuit also includes a second conversion circuit that is within the second power supply voltage domain and that includes a second node and a first cross-coupled latch. The first conversion circuit is configured to receive a data signal at the first node, generate a first intermediate differential signal from the data signal, and communicate the first intermediate differential signal to the second conversion circuit. The second conversion circuit is configured to receive the first intermediate differential signal at the first cross-coupled latch, generate a first output signal based on the first intermediate differential signal via the first cross-coupled latch, and output the first output signal from the second node.

Another embodiment of the present disclosure includes an input device. The input device includes a plurality of sensor electrodes and a processing system configured to drive the plurality of sensor electrodes for capacitive sensing. The processing system includes an integrated circuit. The integrated circuit includes a first power supply voltage domain, a second power supply voltage domain, and a cross-domain interface circuit. A positive power supply voltage of the second power supply voltage domain and a negative power supply voltage of the second power supply voltage domain are modulated with respect to the first power supply voltage domain. The cross-domain interface circuit includes a first conversion circuit that includes a first node and that is within the first power supply voltage domain. The cross-domain interface circuit also includes a second conversion circuit that is within the second power supply voltage domain and that includes a second node and a first cross-coupled latch. The first conversion circuit is configured to receive a data signal at the first node, generate a first intermediate differential signal from the data signal, and communicate the first intermediate differential signal to the second conversion circuit. The second conversion circuit is configured to receive the first intermediate differential signal at the first cross-coupled latch, generate a first output signal based on the first intermediate differential signal via the first cross-coupled latch, and output the first output signal from the second node.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
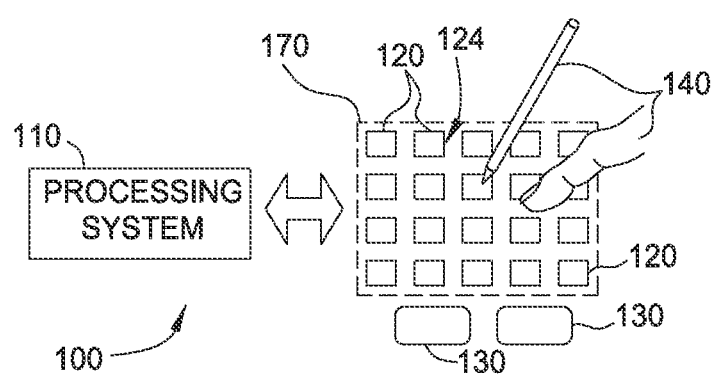
FIG. 1 is a schematic block diagram of an input device integrated into an exemplary display device, according to one embodiment described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present technology provide circuits for transmitting data signals between different power supply voltage domains. A power supply voltage domain refers to a positive power supply voltage and negative power supply voltage and the electrical components powered by those power supply voltages. The circuits described provide elements for improved slew rates and duty cycle matching between power supply voltage domains. The circuits are described in the context of an input device that includes sensing electrodes. However, those of skill in the art would understand that the circuits disclosed can be used in a variety of contexts.

FIG. 1 is a schematic block diagram of an input device 100, in accordance with embodiments of the present technology. Although the illustrated embodiments of the present disclosure are shown as an input device integrated with a display device, it is contemplated that the invention may be embodied in the input devices that are not integrated with display devices. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include $I^2C$, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 170. Example input objects include fingers and styli, as shown in FIG. 1.

Sensing region 170 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 170 extends from a surface of the input device 100 in one or more directions into space until signal-to-noise ratios prevent sufficiently accurate object detection. The distance to which this sensing region 170 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 170 has a rectangular shape when projected onto an input surface of the input device 100.

The input device 100 may utilize any combination of sensor components and sensing technologies to detect user input in the sensing region 170. The input device 100 comprises a plurality of sensing elements 124 for detecting user input. The sensing elements 124 include a plurality of sensor electrodes 120. As several non-limiting examples, the input device 100 may use capacitive, elastive, resistive, inductive, magnetic acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements 124 pickup loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements 124 to create electric fields. In some capacitive implementations, separate sensing elements 124 may be ohmically shorted together to form larger sensor electrodes. Some capacitive implementations utilize resistive sheets, which may be uniformly resistive.

As discussed above, some capacitive implementations utilize "self capacitance" (or "absolute capacitance") sensing methods based on changes in the capacitive coupling between sensor electrodes 120 and an input object. In various embodiments, an input object near the sensor electrodes 120 alters the electric field near the sensor electrodes 120, thus changing the measured capacitive coupling. In one implementation, an absolute capacitance sensing method operates by modulating sensor electrodes 120 with respect to a reference voltage (e.g. system ground), and by detecting the capacitive coupling between the sensor electrodes 120 and input objects 140.

Additionally as discussed above, some capacitive implementations utilize "mutual capacitance" (or "transcapacitance") sensing methods based on changes in the capacitive coupling between sensor electrodes 120. In various embodiments, an input object 140 near the sensor electrodes 120 alters the electric field between the sensor electrodes 120, thus changing the measured capacitive coupling. In one implementation, a transcapacitive sensing method operates by detecting the capacitive coupling between one or more transmitter sensor electrodes (also "transmitter electrodes") and one or more receiver sensor electrodes (also "receiver electrodes") as further described below. Transmitter sensor electrodes may be modulated relative to a reference voltage (e.g., system ground) to transmit a modulated signals. Receiver sensor electrodes may be held substantially constant relative to the reference voltage to facilitate receipt of resulting signals. A resulting signal may comprise effect(s) corresponding to one or more modulated signals, and/or to one or more sources of environmental interference (e.g. other electromagnetic signals). Sensor electrodes 120 may be dedicated transmitter electrodes or receiver electrodes, or may be configured to both transmit and receive.

In FIG. 1, the processing system 110 is shown as part of the input device 100. The processing system 110 is configured to operate the hardware of the input device 100 to detect input in the sensing region 170. The processing system 110 comprises parts of or all of one or more integrated circuits (105) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) 124 of the input device 100. In other embodiments, components of processing system 110 are physically separate with one or more components close to sensing element(s) 124 of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc. In one or more embodiments, a grid electrode may be disposed between two or more senor electrodes 120 and processing system 110 may be configured to drive the grid electrode with a guarding signal which may be configured to guard the sensor electrodes. The grid electrode may be disposed on the same layer as the sensor electrode and comprise one or more common electrodes. In other embodiments, the grid electrode may be disposed on a layer separate from the sensor electrodes. In one embodiment, a first grid electrode may be disposed on a first layer common with the sensor electrode and a second grid electrode may be disposed on a second layer that is between the sensor electrodes and an input surface of the input device 100. In one embodiment, the grid electrode may be segmented into multiple segments that may be driven individually by the processing system 110. In one embodiment a first grid electrode is disposed such that it at least partially circumscribes a first subset of sensor electrodes and a second grid electrode is disposed such that it is at least partially circumscribes a second subset of sensor electrodes. In other embodiments, the input device 100 may comprise more than two grid electrodes. The grid electrode(s) and the sensor electrode may encompass the entire surface of the Vcom electrode.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) 124 to detect input, identification modules configured to identify gestures such as mode changing gestures, and mode changing modules for changing operation modes.

In some embodiments, the processing system 110 responds to user input (or lack of user input) in the sensing region 170 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing elements) 124 of the input device 100 to produce electrical signals indicative of input (or lack of input) in the sensing region 170. The processing system 110 may perform any appropriate amount of processing on the electrical signals in producing the information provided to the electronic system. For example, the processing system 110 may digitize analog electrical signals obtained from the sensing elements 124. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 170, or some other functionality. FIG. 1 shows buttons 130 near the sensing region 170 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 170 overlaps at least part of an active area of a display screen of display device. For example, the input device 100 may comprise substantially transparent sensing elements 124 overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display device may share physical elements. For example, some embodiments may utilize some of the same electrical components for displaying and for sensing. As another example, the display device may be operated in part or in total by the processing system 110.

It should be understood that while many embodiments of the present technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
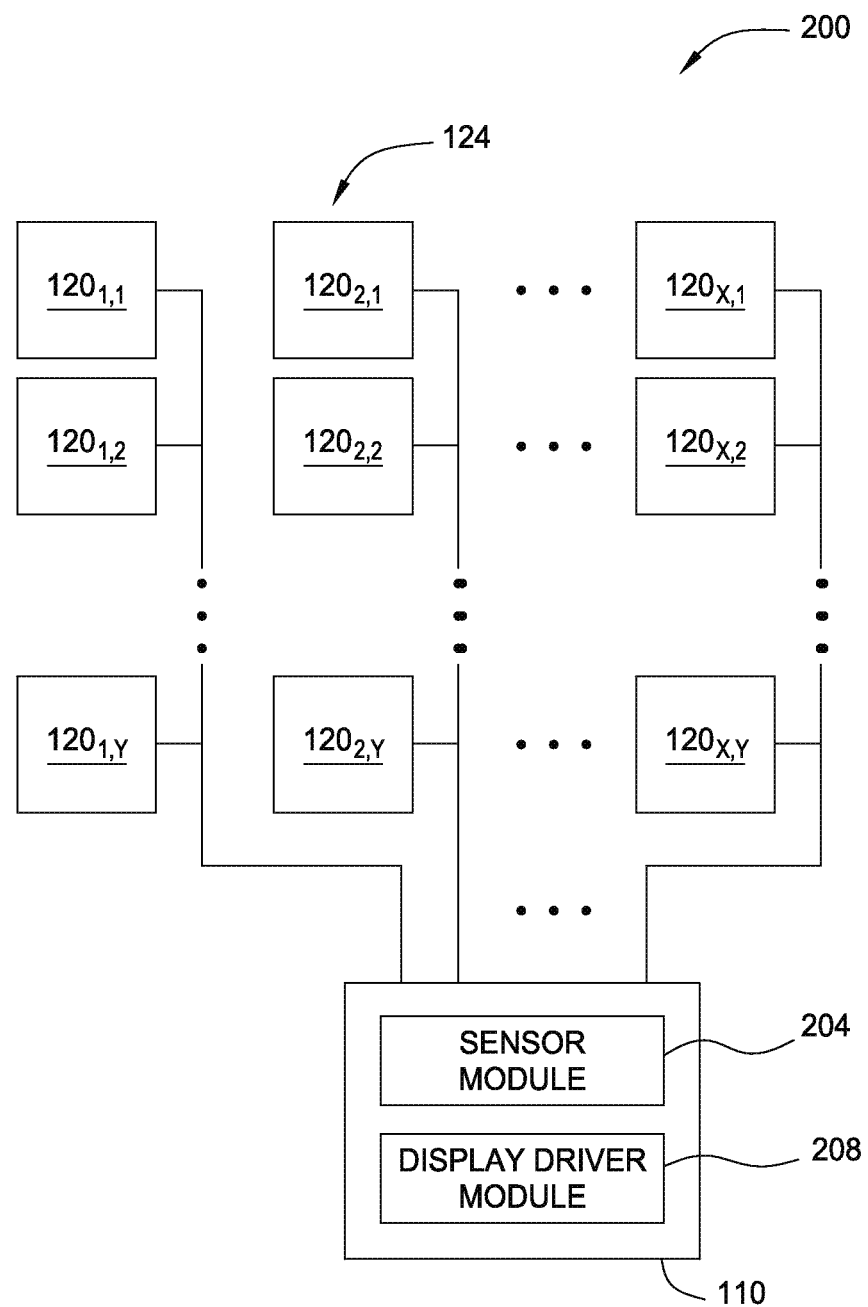
FIG. 2 illustrates a simplified exemplary array of sensor elements that may be used in the input device of FIG. 1, according to one embodiment described herein.

FIG. 2 shows a portion of an exemplary pattern 200 of sensing elements 124 configured to sense in the sensing region 170 associated with the pattern 200, according to some embodiments. For clarity of illustration and description, FIG. 2 shows the sensor electrodes 120 of the sensing elements 124 in a pattern of simple rectangles, and does not show various other components. The exemplary pattern 200 of sensing elements 124 comprises an array of sensor electrodes $120_{X,Y}$ (referred collectively as sensor electrodes 120) arranged in X columns and Y rows, wherein X and Y are positive integers. It is contemplated that the pattern of sensing elements 124 comprises a plurality of sensor electrodes 120 having other configurations, such as polar arrays, repeating patterns, non-repeating patterns, overlapping patterns, a single row or column, or other suitable arrangement. The sensor electrodes 120 are coupled to the processing system 110 and utilized to determine the presence (or lack thereof) of an input object 140 in the sensing region 170.

In one mode of operation, the arrangement of sensor electrodes 120 (120-1, 120-2, 120-3, ... 120-$n$) may be utilized to detect the presence of an input object via absolute sensing techniques. That is, processing system 110 is configured to drive each sensor electrode 120 with a signal and receive a resulting signal comprising effects corresponding to the modulated signal, which is utilized by the processing system 110 or other processor to determine the position of the input object.

The sensor electrodes 120 are typically ohmically isolated from each other. That is, one or more insulators separate the sensor electrodes 120 and prevent them from electrically shorting to each other. In some embodiments, the sensor electrodes 120 are separated by an insulative gap. The insulative gap separating the sensor electrodes 120 may be filled with an electrically insulating material, or may be an air gap.

In another mode of operation, the sensor electrodes 120 (120-1, 120-2, 120-3, ... 120-$n$) may be utilized to detect the presence of an input object via profile sensing techniques. That is, processing system 110 is configured to drive the sensor electrodes 120 row-by-row and then column-by-column, with modulated signals. The signals generated in response to driving the sensor electrodes 120 in this configuration provide information related to the position of an input object 140 within the sensing region.

In a further mode of operation, the sensor electrodes 120 may be split into groups of transmitter and receiver electrodes utilized to detect the presence of an input object via transcapacitive sensing techniques. That is, processing system 110 may drive a first group of sensor electrodes 120 with a modulated signal and receive resulting signals with the second group of sensor electrodes 120, where a resulting signal comprising effects corresponding to the modulated signal. The resulting signal is utilized by the processing system 110 or other processor to determine the position of the input object.

The input device 100 may be configured to operate in any one of the modes described above. The input device 100 may also be configured to switch between any two or more of the modes described above.

Areas of localized capacitive coupling may be termed "capacitive pixels." Capacitive pixels may be formed between an individual sensor electrode 120 and ground in the first mode of operation, between groups of sensor electrodes 120 and ground in the second mode of operation, and between groups of sensor electrodes 120 used as transmitter and receiver electrodes in the third mode of operation. The capacitive coupling changes with the proximity and motion of input objects 140 in the sensing region 170 associated with the sensing elements 124, and thus may be used as an indicator of the presence of the input object in the sensing region of the input device 100.

In some embodiments, the sensor electrodes 120 are "scanned" to determine these capacitive couplings. That is, in one embodiment, one or more of the sensor electrodes 120 are driven to transmit modulated signals. Transmitters may be operated such that one transmitter electrode transmits at one time, or multiple transmitter electrodes transmit at the same time. Where multiple transmitter electrodes transmit simultaneously, the multiple transmitter electrodes may transmit the same modulated signal and effectively produce an effectively larger transmitter electrode. Alternatively, the multiple transmitter electrodes may transmit different modulated signals. For example, multiple transmitter electrodes may transmit different modulated signals according to one or more coding schemes that enable their combined effects on the resulting signals to be independently determined.

The sensor electrodes 120 configured as receiver sensor electrodes may be operated singly or multiply to acquire resulting signals. The resulting signals may be used to determine measurements of the capacitive couplings at the capacitive pixels.

In another embodiment, the sensor electrodes may be operated such that more than one sensor electrode is driven and received with at a time, or sensor electrodes are driven and received with at the same time. In such embodiments, an absolute capacitive measurement may be obtained from each of the one or more sensor electrodes 120 simultaneously.

In one embodiment each of the sensor electrodes 120 are simultaneously driven and received with, obtaining an absolute capacitive measurement simultaneously from each of the sensor electrodes 120. In various embodiments, processing system 110 may configured to selectively drive and receive with a portion of sensor electrodes 120. For example, the sensor electrodes may be selected based on, but not limited to, an application running on the host processor, a status of the input device, and an operating mode of the sensing device.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

The background capacitance of the input device 100 is the capacitive image associated with no input object in the sensing region 170. The background capacitance changes with the environment and operating conditions, and may be estimated in various ways. For example, some embodiments take "baseline images" when no input object is determined to be in the sensing region 170, and use those baseline images as estimates of their background capacitances.

Capacitive images can be adjusted for the background capacitance of the input device 100 for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

In some touch screen embodiments, one or more of the sensor electrodes 120 comprise one or more display electrodes used in updating the display of the display screen. In one or more embodiment, the display electrodes comprise one or more segments of a segmented $V_{COM}$ electrode, a source drive line, gate line, an anode electrode or cathode electrode, or any other display element. These display electrodes may be disposed on an appropriate display screen substrate. For example, the display electrodes may be disposed on the a transparent substrate (a glass substrate, TFT glass, or any other transparent material) in some display screens (e.g., In Plane. Switching (IPS) or Plane to Line Switching (PLS) Organic Light Emitting Diode (OLED)), on the bottom of the color filter glass of some display screens (e.g., Patterned Vertical Alignment (PVA) or Multi-domain Vertical Alignment (MVA)), over an emissive layer (OLED), etc. In such embodiments, a display electrode operated for display updating and capacitive sensing can also be referred to as a "combination electrode", since it performs multiple functions. In various embodiments, each of the sensor electrodes 120 comprises one or more common electrodes. In other embodiments, at least two sensor electrodes 120 may share at least one common electrode.

In various touch screen embodiments, the "capacitive frame rate" (the rate at which successive capacitive images are acquired) may be the same or be different from that of the "display frame rate" (the rate at which the display image is updated, including refreshing the screen to redisplay the same image). In various embodiments, the capacitive frame rate is an integer multiple of the display frame rate. In other embodiments, the capacitive frame rate is a fractional multiple of the display frame rate. In yet further embodiments, the capacitive frame rate may be any fraction or integer of the display frame rate.

Continuing to refer to FIG. 2, the processing system 110 coupled to the sensing electrodes 120 includes a sensor module 204 and optionally, a display driver module 208. The sensor module 204 includes circuitry configured to drive a modulated signal onto the sensing electrodes 120 during periods in which input sensing is desired. The modulated signal is generally a modulated signal containing one or more bursts over a period of time allocated for input sensing. The modulated signal may have an amplitude, frequency and voltage which may be changed to obtain more robust location information of the input object in the sensing region 170. The sensor module 204 may be selectively coupled to one or more of the sensor electrodes 120. For example, the sensor module 204 may be coupled to selected portions of the sensor electrodes 120. In another example, the sensor module 204 may be coupled to a different portion of the sensor electrodes 120. In yet another example, the sensor module 204 may be coupled to all the sensor electrodes 120 and operate in either an absolute or transcapacitive sensing mode.

In one or more embodiments, capacitive sensing (or input sensing) and display updating may occur during at least partially overlapping periods. For example, as a common electrode is driven for display updating, the common electrode may also be driven for capacitive sensing. In another embodiment, capacitive sensing and display updating may occur during non-overlapping periods, also referred to as non-display update periods. In various embodiments, the non-display update periods may occur between display line update periods for two display lines of a display frame and may be at least as long in time as the display line update period. In such embodiment, the non-display update period may be referred to as a long horizontal blanking period, long h-blanking period or a distributed blanking period. In other embodiments, the non-display update period may comprise horizontal blanking periods and vertical blanking periods. Processing system 110 may be configured to drive sensor electrodes 120 for capacitive sensing during any one or more of or any combination of the different non-display update times, or during a display update time.

The sensor module 204 also includes circuitry configured to receive a resulting signal with the sensor electrodes 120 comprising effects corresponding to the modulated signal during periods in which input sensing is desired. The sensor module 204 may determine a position of the input object 140 in the sensing region 170 or may provide a signal including information indicative of the resulting signal to another module or processor, for example, a determination module or a processor of the electronic system (i.e., a host processor), for determining the position of the input object 140 in the sensing region 170.

The display driver module 208 may be included in or may be separate from the processing system 110. The display driver module 208 includes circuitry configured to provide display image update information to the display of the display device during non-sensing (e.g., display updating) periods or during sensing periods.

As discussed above, the sensor electrodes 120 of the sensing elements 124 may be formed as discrete geometric forms; polygons, bars, pads, lines or other shape, which are ohmically isolated from one another. The sensor electrodes 120 may be electrically coupled through circuitry to form electrodes of having larger plan area relative to a discrete one of the sensor electrodes 120. The sensor electrodes 120 may be fabricated from opaque or non-opaque conductive materials. In embodiments wherein the sensor electrodes 120 are utilized with a display device, it may be desirable to utilize non-opaque conductive materials for the sensor electrodes 120. In embodiments wherein the sensor electrodes 120 are not utilized with a display device, it may be desirable to utilize opaque conductive materials having lower resistivity for the sensor electrodes 120 to improve sensor performance. Materials suitable for fabricating the sensor electrodes 120 include ITO, aluminum, silver, copper, and conductive carbon materials, among others. The sensor electrodes 120 may be formed as contiguous body of conductive material having little or no open area (i.e., having a planar surface uninterrupted by holes), or may alternatively be fabricated to form a body of material having openings formed therethrough. For example, the sensor electrodes 120 may be formed of a mesh of conductive material, such as a plurality of interconnected thin metal wires or carbon nanotubes.

When the sensor electrodes 120 are being driven with modulated signals for capacitive sensing, the sensor electrodes 120 may experience effects related to parasitic capacitance due to capacitive coupling between the sensor electrodes 120 and other nearby conductive components such as other sensor electrodes 120, as well as traces and other electrodes. In some embodiments, this parasitic capacitance can reduce the ability to detect the presence of that input object through the use of capacitive sensing techniques.

To reduce the effects related to parasitic capacitance, the power supply that provides power to various components of the input device 100 is configured to generate modulated power supply signals and a modulated ground signal. The modulated power supply signals and modulated ground signal cause the various components of the input device 100 described above that would normally be held at a substantially constant voltage with respect to earth ground to instead be driven with a modulated signal with respect to earth ground. In other words, by powering the input device 100 with a modulated power supply, various signals in the input device 100 are modulated. The sensor electrodes 120 can then be operated simply by maintaining the sensor electrodes 120 at a constant voltage with respect to the modulated ground signal. Since the input object 140 is (generally) at earth ground, the voltage differential between the sensor electrodes 120 and the input object 140 varies with time. Further, by maintaining the sensor electrodes 120 at a constant voltage with respect to the modulated ground signal, and thus other components of the input device 100, the effects of parasitic capacitance experienced by the sensor electrodes 120 are reduced. More specifically, the effects of parasitic capacitance are reduced because the voltage of the sensor electrodes 120 remains substantially constant with respect to other components of the input device 100. The modulated power supply may modulate voltages for some components in the input device 100 but not for other components in the input device 100.

In various embodiments, input device 100 may comprise display device having an integrated input sensing device. As is described above, in such embodiments, one or more display electrodes may be configured to perform both display updating and capacitive sensing. During display update periods, an electrode in the $V_{COM}$ layer (common electrode or $V_{COM}$ electrode) forms the fixed electrode for the storage capacitor and liquid crystal material, with the charge stored between the $V_{COM}$ electrode and the pixel electrode. The amount of charge stored between the $V_{COM}$ electrode and pixel electrode determine the transmission (for a liquid crystal display (LCD) or production (for an organic light emitting diode OLED) of light. For an OLED pixel element, during display update periods charge is stored on a storage capacitor within a pixel. The charge that is stored in the capacitor controls flow of current through the OLED pixel element, for example, by being applied to a gate of a transistor. During an input sensing period, the one or more common electrodes corresponding to sensor electrodes 120 are driven to a first voltage potential and the resulting charge that is required drive the sensor electrode(s) to the first voltage potential is measured by the sensor module 204. In various embodiments, the sensor electrodes may be driven with a modulated voltage that transitions the sensor electrode(s) between a first voltage potential and a second voltage potential. In other embodiments, processing system 110 may be configured to drive a sensor electrode with a predetermined amount of charge and the corresponding voltage on the sensor electrode is measured. In any of the above embodiments, the signal driven onto the sensor electrode may be referred to as a modulated signal and the charge or voltage that is measured may be referred to as resulting signals that are received with the sensor electrode(s). In various embodiments, the modulated signal may be a modulated voltage or a modulated charge. If the modulated signal is a voltage, charge is measured. If the modulated signal is a charge, voltage is measured. The resulting signal includes the effects of both local parasitic capacitances between a sensor electrode and proximate conductors and the capacitance between the sensor electrode and the input object. In various embodiments, the capabilities of the sensor module 204 and the input device 100 may be improved by reducing the effects of parasitic capacitances that are present in the resulting signals.

Figure 3:
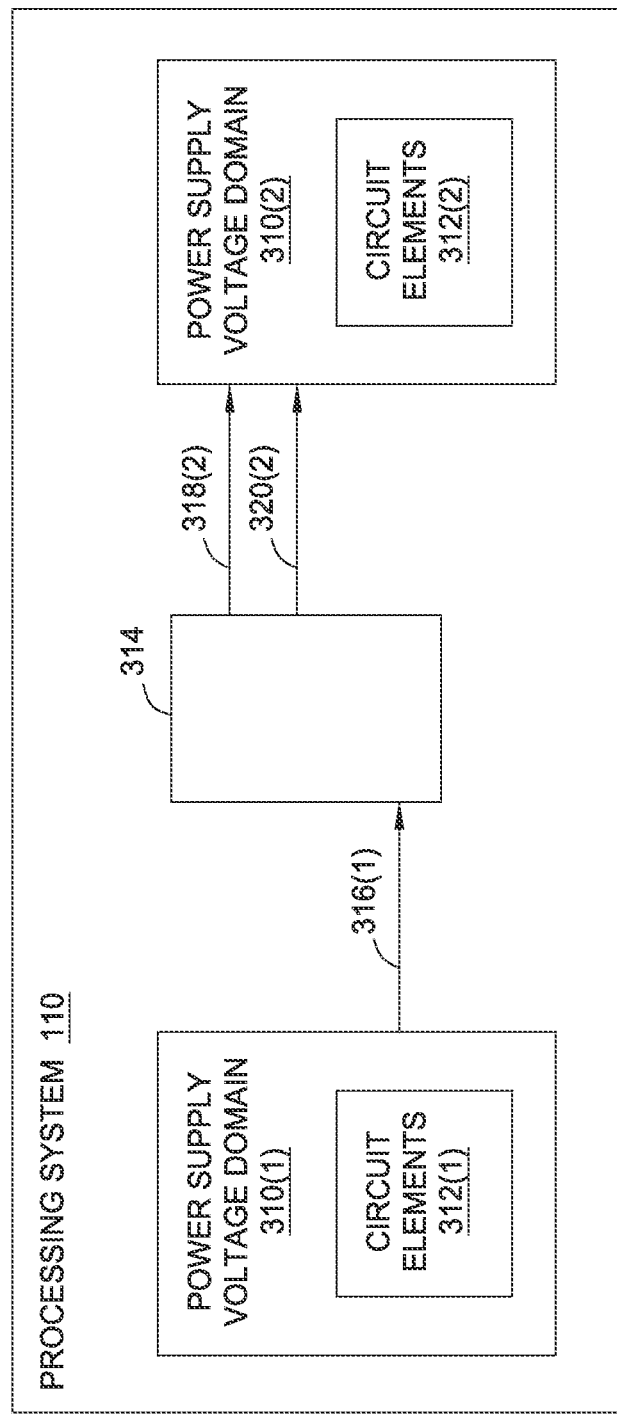
FIG. 3 illustrates different power supply voltage domains within a processing system included in the input device of FIG. 1.

FIG. 3 is a block diagram of a processing system 110 that includes a first power supply voltage domain 310(1) and a second power supply voltage domain 310(2), according to an embodiment. Each power supply voltage domain 310 includes circuit elements 312 of the processing system 110 that are operated with a particular pair of a positive power supply voltage and a negative power supply voltage. The positive power supply voltage and negative power supply voltage for the first power supply voltage domain 310(1) are modulated with respect to the positive power supply voltage and negative power supply voltage for the second power supply voltage domain 310(2). In other words, the modulated power supply applies modulated voltages to either the first power supply voltage domain or the second power supply voltage domain, which means that the positive power supply voltage and negative power supply voltage of one power supply voltage domain are modulated with respect to the positive power supply voltage and negative power supply voltage of the other power supply voltage domain. In some embodiments, one power supply voltage domain is modulated with respect to another power supply voltage domain in at least one of amplitude, frequency, or phase. In some embodiments, one power supply voltage domain is modulated with respect to another power supply voltage domain in an intermittent fashion.

In FIG. 3, the two power supply voltage domains 310(1), 310(2) are shown as being included in the processing system 110. In embodiments in which the processing system 110 is a single integrated circuit, the two power supply voltage domains 310 are located within a single integrated circuit. In other embodiments, the two power supply voltage domains 310 are located within different integrated circuits.

Because the positive power supply voltage and negative power supply voltage of one power supply voltage domain are modulated with respect to the positive power supply voltage and negative power supply voltage of the other power supply voltage domain, signals generated in a first power supply voltage domain 310 are not necessarily able to be used in a second power supply voltage domain 310. More specifically, because the voltage levels differ, a signal that used in the first power supply voltage domain 310 may be interpreted as an incorrect logical value (e.g., high instead of low) in the second power supply domain 310, may cause jitter in receiving the signal in the second domain, or may have a voltage that is not within the operating constraints of the second power supply domain. Thus, a cross-domain interface unit 314 is provided to "convert" signals generated in a first power supply voltage domain 310 for use in a second power supply voltage domain 310.

The cross-domain interface unit 314 accepts an input signal over input line 316 from a first power supply voltage domain 310 and converts the input signal into a positive logic output signal and a negative logic output signal. The cross-domain interface unit 314 transmits the positive logic output signal over positive output line 318(2) to the second power supply voltage domain 310 and transmits the negative logic output signal over negative output line 320(2) to the second power supply voltage domain 310. FIGS. 4-7 illustrate several embodiments of circuits used in the cross-domain interface unit 314.

Figure 4:
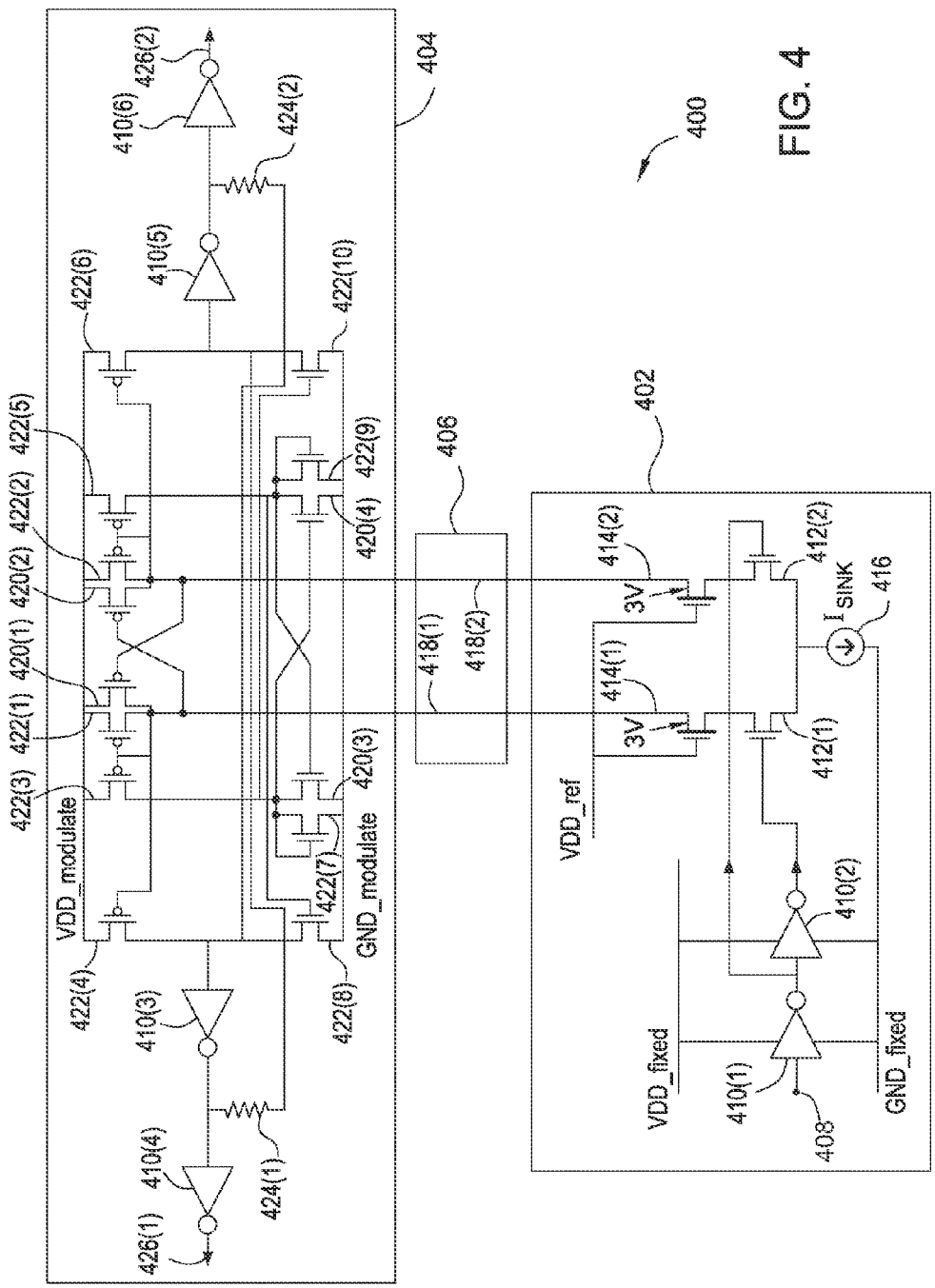
FIGS. 4-7 illustrate embodiments of a cross-domain interface circuit included in the processing system of FIG. 3.

FIG. 4 illustrates a cross-domain interface circuit 400 for use in the cross-domain interface unit 314 of FIG. 3, according to an embodiment. The cross-domain interface circuit 400 includes a first conversion circuit 402 that is coupled to a second conversion circuit 404 via a differential pair 406. The first conversion circuit 402 is within a first power supply voltage domain and the second version circuit 404 is within a second power supply voltage domain. Thus, the cross-domain interface circuit 400 is used to convert data signals input from the first power supply voltage domain into data signals output to the second power supply voltage domain. The negative power supply voltage of the first power supply voltage domain remains equal to or below the negative power supply voltage of the second power supply voltage domain. Similarly, the positive power supply voltage of the first power supply voltage domain remains equal to or below the positive power supply voltage of the second power supply voltage domain.

The first conversion circuit 402 includes a first inverter 410(1), a second inverter 410(2), a first differential pair transistor 412(1), a second differential pair transistor 412(2) (together, a differential pair of transistors), a first cascode transistor 414(1), a second cascode transistor 414(2), and a controlled-current source 416 that passes current $I_{SINK}$. The differential pair 406 includes a first differential pair line 418(1) and a second differential pair line 418(2).

The second conversion circuit 404 includes a first latch transistor 420(1), a second latch transistor 420(2), a third latch transistor 420(3), a fourth latch transistor 420(4), a first current mirror transistor 422(1) (also referred to as a first differential current source), a second current mirror transistor 422(2) (also referred to as a second differential current source), a third current mirror transistor 422(3), a fourth current mirror transistor 422(4), a fifth current mirror transistor 422(5), a sixth current mirror transistor 422(6), a seventh current mirror transistor 422(7), an eighth current mirror transistor 422(8), a ninth current mirror transistor 422(9), a tenth current mirror transistor 422(10), a third inverter 410(3), a fourth inverter 410(4), a fifth inverter 410(5), a sixth inverter 410(6), a first resistor 424(1), and a second resistor 424(2). The third current mirror transistor 422(3) and fourth current mirror transistor 422(4) are referred to herein as a first pair of current mirror sources. The fifth current mirror transistor 422(5) and sixth current mirror transistor 422(6) are referred to herein as a second pair of current mirror sources. The seventh current mirror transistor 422(7) and eighth current mirror transistor 422(8) are referred to herein as a first pair of current mirror sinks. The ninth current mirror transistor 422(9) and tenth current mirror transistor 422(10) are referred to herein as a second pair of current mirror sinks. The first latch transistor 420(1) and second latch transistor 420(2) are referred to herein as a first cross-coupled latch. The third latch transistor 420(3) and fourth latch transistor 420(4) are referred to herein as a second cross-coupled latch. The third inverter 410(3) and fourth inverter 410(4) are referred to as a first pair of buffering inverters. The fifth inverter 410(5) and the sixth inverter 410(6) are referred to as a second pair of buffering inverters.

In the first conversion circuit 402, the input of the first inverter 410(1) is coupled to the first node 408, which is coupled to an input line 316 of a power supply voltage domain 310. The output of the first inverter 410(1) is coupled to the input of the second inverter 410(2) and to the gate of the second differential pair transistor 412(2). The output of the second inverter 410(2) is coupled to the gate of the first differential pair transistor 412(1). The sources of both the first differential pair transistor 412(1) and the second differential pair transistor 412(2) are coupled to the controlled-current source 416, which is coupled to the negative power supply of the first power supply voltage domain. The drain of the first differential pair transistor 412(1) is coupled to the source of the first cascode transistor 414(1) and the drain of the second differential pair transistor 412(2) is coupled to the source of the second cascode transistor 414(2). The gate of both the first cascode transistor 414(1) and the second cascode transistor 414(2) are coupled to a reference voltage. In this configuration, the drains of the first differential pair transistor 412(1) and the second differential pair transistor 412(2) will not exceed $V_{REF}$. Thus, the reference voltage $V_{REF}$ is set to limit these drain voltages to values that are safe for the first differential pair transistor 412(1) and the second differential pair transistor 412(2). The reference voltage $V_{REF}$ is set such that drain voltage of first differential pair transistor 412(1) and drain voltage of second differential pair transistor 412(2) do not substantially degrade the device reliability of the first differential pair transistor 412(1) and the second differential pair transistor 412(2). The reference voltage $V_{REF}$ is also set such that the first differential pair transistor 412(1) and the second differential pair transistor 412(2) both operate within the saturation region regardless of the voltage differential between the two power supply domains due to modulation, in order to minimize timing variations. The first cascode transistor 414(1) and the second cascode transistor 414(2) are thick-oxide devices, so that they are able to withstand higher gate to drain voltages. In one embodiment, $V_{REF}$ is set to be 3V above GND_fixed.

In the second conversion circuit 404, the drain of the first latch transistor 420(1) is coupled to the gate of the second latch transistor 420(2), and the drain of the second latch transistor 420(2) is coupled to the gate of the first latch transistor 420(1), to form a cross-coupled latch. The drain of the first latch transistor 420(1) is also coupled to the drain of cascode transistor 414(1), the drain of the first current mirror transistor 422(1), and to the gates of the first current mirror transistor 422(1), the third current mirror transistor 422(3), and the fourth current mirror transistor 422(4). The drain of the second latch transistor 420(2) is coupled to the drain of cascode transistor 414(2), the drain of the second current mirror transistor 422(2), and to the gates of the second current mirror transistor 422(2), the fifth current mirror transistor 422(5), and the sixth current mirror transistor 422(6).

The drain of the fourth current mirror transistor 422(4) is coupled to the drain of the eighth current mirror transistor 422(8), to the input of the third inverter 410(3), and to the second resistor 424(2). The drain of the sixth current mirror transistor 422(6) is coupled to the drain of the tenth current mirror transistor 422(10), to the first resistor 424(1), and to the input of the fifth inverter 410(5). The drain of the third current mirror transistor 422(3) is coupled to the drains of the third latch transistor 420(3) and the seventh current mirror transistor 422(7), and to the gates of the seventh current mirror transistor 422(7), the fourth latch transistor 420(4), and the tenth latch transistor 420(10). The drain of the fifth current mirror transistor 422(5) is coupled to the drains of the fourth latch transistor 420(4) and the ninth current mirror transistor 422(9), to the gates of the third latch transistor 420(3) and the eighth current mirror transistor 422(8), and to the gate of the ninth current mirror transistor 422(9).

The output of the third inverter 410(3) is coupled to the first resistor 424(1) and to the input of the fourth inverter 410(4). The output of the fourth inverter 410(4) is coupled to the positive output node 426(1), which is coupled to a positive output line 318. The output of the fifth inverter 410(5) is coupled to the input of the sixth inverter 410(6) and to the second resistor 424(2). The output of the sixth inverter 410(6) is coupled to the negative output node 426(2), which is coupled to a negative output line 320. Thus, the first pair of buffering inverters is cross-coupled to the second pair of buffering inverters with a pair of resistors (resistor 424(1) and resistor 424(2)).

The first latch transistor 420(1), the second latch transistor 420(2), the first current mirror transistor 422(1), the second current mirror transistor 422(2), the third current mirror transistor 422(3), the fourth current mirror transistor 422(4), the fifth current mirror transistor 422(5), and the sixth current mirror transistor 422(6) are p-type metal-oxide-semiconductor transistors (PMOS). The rest of the transistors are n-type metal-oxide-semiconductor transistors (NMOS). In some embodiments, PMOS cascode transistors are placed below and in series with the third current mirror transistor 422(3) and the fifth current mirror transistor 422(5).

In operation, an input signal (also referred to as a "data signal") applied to the input node 408 is applied to the first inverter 410(1), which generates an output that is the logical inverse of the input signal. This logical inverse is applied to the second inverter 410(2), which generates an output that is the logical inverse of the output of the first inverter 410(1), which is logically the same as the input signal. The logical inverse is applied to the gate of the second differential pair transistor 412(2) and the logical value of the input signal is applied to the gate of the first differential pair transistor. Thus, when the input signal has a logical high value, the first differential pair transistor 412(1) (and thus the first differential pair line 418(1)) passes $I_{SINK}$ and the second differential pair transistor 412(2) passes no current. The combination of the signal traveling on the first differential pair line 418(1) and the second differential pair line 418(2) is referred to herein as a first intermediate differential signal. This first intermediate differential signal is provided to the first latch transistor 420(1) and the second latch transistor 420(2), which together are referred to herein as a first cross-coupled latch. The signal on the first differential pair line is provided to the first current mirror transistor 422(1), the third current mirror transistor 422(3), and the fourth current mirror transistor 422(4) (together, a first current mirror), which generate a first current mirror signal in response. The signal on the second differential pair line is also provided to the second current mirror transistor 422(2), the fifth current mirror transistor 422(5), and the sixth current mirror transistor 422(6) (together, a second current mirror), which generate a second current mirror signal in response. The first current mirror signal and second current mirror signal together are called a second intermediate differential signal. This second intermediate differential signal drives the second cross-coupled latch. The second intermediate differential signal also drives the first pair of current mirror sinks as well as the second pair of current mirror sinks.

When the input signal has a logical low value, the second differential pair transistor 412(2) (and thus the second differential pair line 418(2)) passes $I_{SINK}$, and the first differential pair transistor 412(1) passes no current.

As described above, when the input signal is a logical low; the first differential pair line 418(1) passes no current, and the second differential pair line 418(2) passes $I_{SINK}$. Because the second differential pair line 418(2) is pulled down towards the negative power supply voltage in the first power supply voltage domain, the first latch transistor 420(1) is activated and passes current from the positive power supply voltage of the second power supply voltage domain. Passing this current causes the voltage at the drain of the first latch transistor 420(1) to be pulled up towards the positive power supply voltage of the second power supply voltage domain, which deactivates the second latch transistor 420(2). Additionally, the voltage at the drain of the second latch transistor 420(2), which is pulled down towards the negative power supply voltage of the first power supply voltage domain, activates the second current mirror transistor 422(2), the fifth current mirror transistor 422(5), and the sixth current mirror transistor 422(6). The current flowing through the second current mirror transistor 422(2) is $I_{SINK}$, and the fifth current mirror transistor 422(5) and sixth current mirror transistor 422(6) mirrors the current flowing through the second current mirror transistor 422(2) and thus is $I_{SINK}$.

The cascode transistor 414(1) protects the first differential pair transistor 412(1) from the high positive power supply voltage of the second power supply voltage domain and serves to keep the voltage at the drain of the first differential pair transistor 412(1) relatively constant, which keeps the switching threshold of the first differential pair transistor 412(1) constant and prevents jitter caused by modulation. Similarly, the cascode transistor 414(2) protects the second differential pair transistor 412(2) from the high positive power supply voltage of the second power supply voltage domain and serves to keep the voltage at the drain of the second differential pair transistor 412(2) relatively constant, which keeps the switching threshold of the second differential pair transistor 412(2) constant and prevents jitter caused by modulation.

Because the sixth current mirror transistor 422(6) is activated, the input of the fifth inverter 410(5) is high, which causes the input of the sixth inverter 410(6) to be low, which causes the inverted output node 426(2) to be high. The voltage at the inverted output node 426(2) is modulated with respect to the first power supply voltage domain because the sixth inverter 410(6) is powered by the positive and negative power supply voltages of the second power supply voltage domain.

Because the source of the fifth current mirror transistor 422(5) is pulled up towards the positive power supply voltage of the second power supply voltage domain, the third latch transistor 420(3) and the ninth current mirror transistor 422(9) are activated and pass $I_{SINK}$. Activating third latch transistor 420(3) causes the gate of seventh current mirror transistor 422(7) and the fourth latch transistor 420(4) to be pulled low, which deactivates these transistors. Also, because the drain of the fifth current mirror transistor 422(5) is pulled up towards the positive power supply voltage of the second power supply voltage domain, the eighth current mirror transistor 422(8) is activated, which, through the third inverter 410(3) and fourth inverter 410(4), cause positive output node 426(1) to be a logical low.

The first latch transistor 420(1) and second latch transistor 420(2), as well as the third latch transistor 420(3) and fourth latch transistor 420(4) provide feedback that improves the speed at which the output is changed from a high to a low or vice versa. The first resistor 424(1) and second resistor 424(2) also provide feedback that helps in this manner.

When the input signal is a logical high, the second conversion circuit 404 operates in an inverse manner. Thus, the first differential pair transistor 412(1) passes $I_{SINK}$, which causes second latch transistor 420(2), fourth current mirror transistor 422(4), third current mirror transistor 422(3), and first current mirror transistor 422(1) to be activated. Fourth current mirror transistor 422(4) causes the input of third inverter 410(3) to be high, which causes the input of the fourth inverter 410(4) to be low, which causes the positive output node 426(1) to be high. Further, because third current mirror transistor 422(3) is activated, seventh current mirror transistor 422(7) and fourth latch transistor 420(4) are also activated, as is tenth current mirror transistor 422(10). Activating tenth current mirror transistor 422(10) pulls the input of fifth inverter 410(5) down, which pulls the input of sixth inverter 410(6) up, which causes inverted output node 426(2) to be a logical low.

Figure 5:
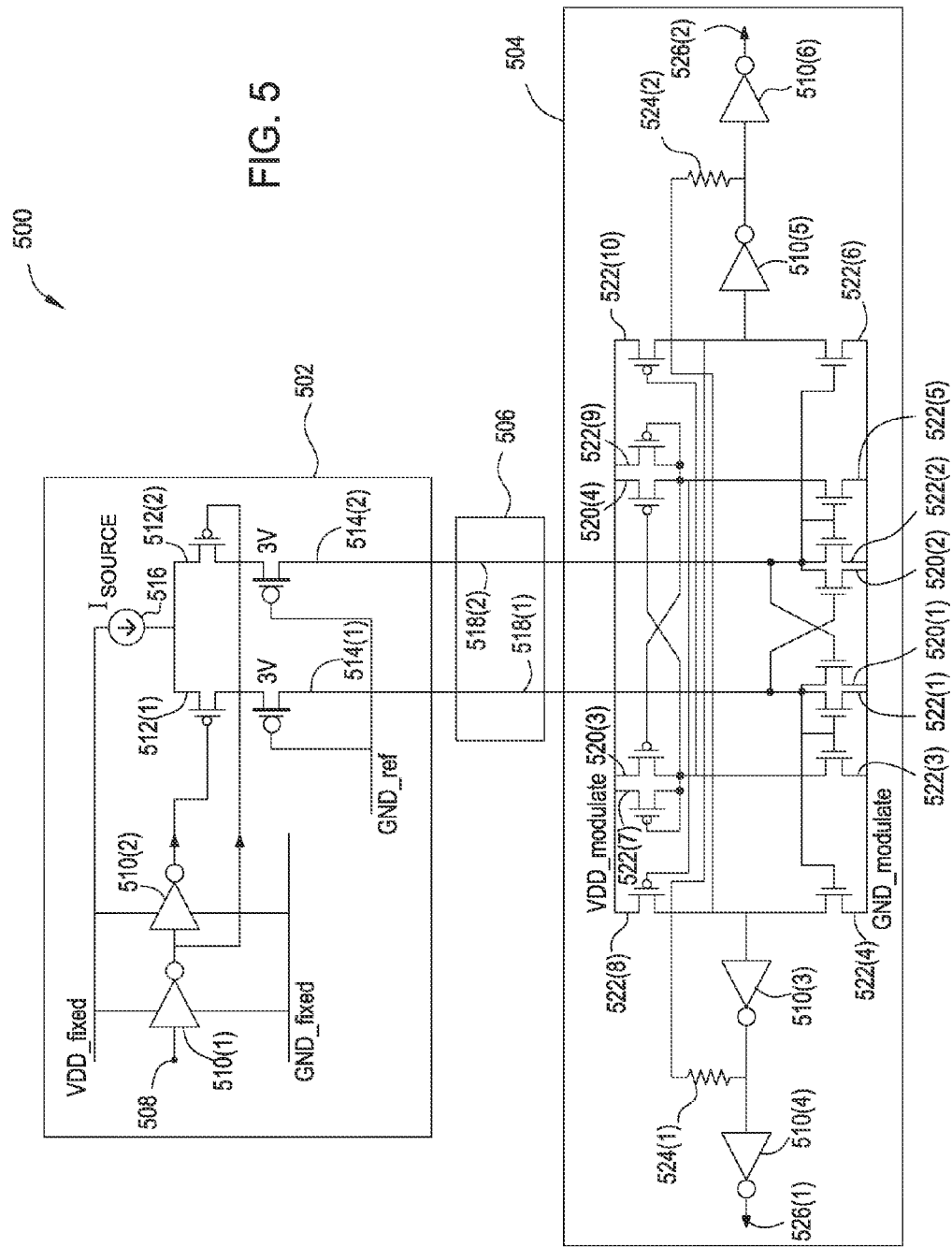

FIG. 5 illustrates a cross-domain interface circuit 500 for use in the cross-domain interface unit 314 of FIG. 3, according to another embodiment. The cross-domain interface circuit 500 includes a first conversion circuit 502 that is coupled to a second conversion circuit 504 via a differential pair 506.

The cross-domain interface circuit 500 is similar to the cross-domain interface circuit 400, except that the cross-domain interface circuit 500 is used to convert input data signals input into a first power supply voltage domain that is higher than a second power supply voltage domain into output data signals output to a second power supply voltage domain. More specifically, the positive power supply voltage of the first power supply voltage domain remains higher than the positive power supply voltage of the second power supply voltage domain and the negative power supply voltage of the first power supply voltage domain remains higher than the negative power supply voltage of the second power supply voltage domain. The input signal is provided to input node 508, which is coupled to input line 316 of a power supply voltage domain 310. The NMOS (n-channel metal oxide semiconductor) transistors of cross-domain interface circuit 400 are replaced with PMOS (p-channel metal oxide semiconductor) transistors and the PMOS transistors of cross-domain interface circuit 400 are replaced with NMOS transistors. Additional details of the cross-domain interface circuit 500 are now provided.

The first conversion circuit 502 includes a first inverter 510(1), a second inverter 510(2), a first differential pair transistor 512(1), a second differential pair transistor 512(2) (together, a differential pair of transistors), a first cascode transistor 514(1), a second cascode transistor 514(2), and a controlled-current source 516 that passes current $I_{SOURCE}$. The differential pair 506 includes a first differential pair line 518(1) and a second differential pair line 518(2). The second conversion circuit 504 includes a first latch transistor 520(1), a second latch transistor 520(2), a third latch transistor 520(3), a fourth latch transistor 520(4), a first current mirror transistor 522(1) (also referred to herein as a first differential current sink), a second current mirror transistor 522(2) (also referred to herein as a second differential current sink), a third current mirror transistor 522(3), a fourth current mirror transistor 522(4), a fifth current mirror transistor 522(5), a sixth current mirror transistor 522(6), a seventh current mirror transistor 522(7), an eighth current mirror transistor 522(8), a ninth current mirror transistor 522(9), and a tenth current mirror transistor 522(10), a third inverter 510(3), a fourth inverter 510(4), a fifth inverter 510(5), a sixth inverter 510(6), a first resistor 524(1), and a second resistor 524(2). The third current mirror transistor 522(3) and fourth current mirror transistor 522(4) are referred to herein as a first pair of current mirror sinks. The fifth current mirror transistor 522(5) and sixth current mirror transistor 522(6) are referred to herein as a second pair of current mirror sinks. The seventh current mirror transistor 522(7) and eighth current mirror transistor 522(8) are referred to herein as a first pair of current mirror sources. The ninth current mirror transistor 522(9) and tenth current mirror transistor 522(10) are referred to herein as a second pair of current mirror sources. The first latch transistor 520(1) and second latch transistor 520(2) are referred to herein as a first cross-coupled latch. The third latch transistor 520(3) and fourth latch transistor 520(4) are referred to herein as a second cross-coupled latch. The third inverter 510(3) and fourth inverter 510(4) are referred to herein as a first pair of buffering inverters. The fifth inverter 510(5) and the sixth inverter 510(6) are referred to herein as a second pair of buffering inverters.

In the first conversion circuit 502, the input of the first inverter 510(1) is coupled to the first node 508, which is coupled to an input line 316 of a power supply voltage domain 310. The output of the first inverter 510(1) is coupled to the input of the second inverter 510(2) and to the gate of the second differential pair transistor 512(2). The output of the second inverter 510(2) is coupled to the gate of the first differential pair transistor 512(1). The sources of both the first differential pair transistor 512(1) and the second differential pair transistor 512(2) are coupled to the controlled-current source 516, which is coupled to the positive power supply of the first power supply voltage domain. The drain of the first differential pair transistor 512(1) is coupled to the source of the first cascode transistor 514(1) and the drain of the second differential pair transistor 512(2) is coupled to the source of the second cascode transistor. The gate of both the first cascode transistor 514(1) and the second cascode transistor 514(2) are coupled to a reference voltage ($V_{REF}$). In this configuration, the drains of the first differential pair transistor 512(1) and the second differential pair transistor 512(2) will not exceed $V_{REF}$. Thus, the reference voltage $V_{REF}$ is set to limit these drain voltages to values that are safe for the first differential pair transistor 512(1) and the second differential pair transistor 512(2). The reference voltage $V_{REF}$ is set such that drain voltage of first differential pair transistor 512(1) and drain voltage of second differential pair transistor 512(2) do not substantially degrade the device reliability of the first differential pair transistor 512(1) and the second differential pair transistor 512(2). The reference voltage $V_{REF}$ is also set such that the first differential pair transistor 512(1) and the second differential pair transistor 512(2) both operate within the saturation region regardless of the voltage differential between the two power supply domains due to modulation, in order to minimize timing variations. The first cascode transistor 514(1) and the second cascode transistor 514(2) are thick-oxide devices, so that they are able to withstand higher gate to drain voltages. In one embodiment, $V_{REF}$ is set to be above 3V below VDD_FIXED.

In the second conversion circuit 504, the drain of the first latch transistor 520(1) is coupled to the gate of the second latch transistor 520(2), and the drain of the second latch transistor 520(2) is coupled to the gate of the first latch transistor 520(1), to form a cross-coupled latch. The drain of the first latch transistor 520(1) is also coupled to the drain of the first current mirror transistor 522(1), and to the gate of the first current mirror transistor 522(1), the third current mirror transistor 522(3), and the fourth current mirror transistor 522(4). The drain of the second latch transistor 520(2) is coupled to the drain of the second current mirror transistor 522(2), and to the gates of the second current mirror transistor 522(2), the fifth current mirror transistor 522(5), and the sixth current mirror transistor 522(6).

The drain of the fourth current mirror transistor 522(4) is coupled to the drain of the eighth current mirror transistor 522(8), to the input of the third inverter 510(3), and to the second resistor 524(2). The drain of the sixth current mirror transistor 522(6) is coupled to the drain of the tenth current mirror transistor 522(10), to the first resistor 524(1), and to the input of the fifth inverter 510(5). The drain of the third current mirror transistor 522(3) is coupled to the drains of the third latch transistor 520(3) and the seventh current mirror transistor 522(7), and to the gates of the seventh current mirror transistor 522(7), the fourth latch transistor 520(4), and the tenth current mirror transistor 522(10). The drain of the fifth current mirror transistor 522(5) is coupled to the drains of the fourth latch transistor 520(4) and the ninth current mirror transistor 522(9), to the gates of the ninth current mirror transistor 522(9), the third latch transistor 520(3) and the eighth current mirror transistor 522(8).

The output of the third inverter 510(3) is coupled to the first resistor 524(1) and to the input of the fourth inverter 510(4). The output of the fourth inverter 510(4) is coupled to the positive output node 526(1), which is coupled to a positive output line 318. The output of the fifth inverter 510(5) is coupled to the input of the sixth inverter 510(6) and to the second resistor 524(2). The output of the sixth inverter 510(6) is coupled to the negative output node 526(2), which is coupled to a negative output line 320. Thus, the first pair of buffering inverters is cross-coupled to the second pair of buffering inverters with a pair of resistors (resistor 524(1) and resistor 524(2)).

The first latch transistor 520(1), the second latch transistor 520(2), the first current mirror transistor 522(1), the second current mirror transistor 522(2), the third current mirror transistor 522(3), the fourth current mirror transistor 522(4), the fifth current mirror transistor 522(5), and the sixth current mirror transistor 522(6) are NMOS transistors. The rest of the transistors are PMOS transistors. In some embodiments, NMOS cascode transistors are placed above and in series with the third current mirror transistor 522(3) and the fifth current mirror transistor 522(5).

In operation, an input signal (also referred to herein as a "data signal") applied to the input node 508 is applied to the first inverter 510(1), which generates an output that is the logical inverse of the input signal. This logical inverse is applied to the second inverter 510(2), which generates an output that is the logical inverse of the output of the first inverter 510(1), which is logically the same as the input signal. The logical inverse is applied to the gate of the second differential pair transistor 512(2) and the logical value of the input signal is applied to the gate of the first differential pair transistor. Thus, when the input signal has a logical high value, the second differential pair transistor 512(2) (and thus the second differential pair line 518(2)) passes $I_{SOURCE}$ and the first differential pair transistor 512(1) passes no current. When the input signal has a logical low value, the first differential pair transistor 512(1) (and thus the first differential pair line 518(1)) passes $I_{SOURCE}$, and the second differential pair transistor 512(2) passes no current. The combination of the signal traveling on the first differential pair line 518(1) and the second differential pair line 518(2) is referred to herein as a first intermediate differential signal. This first intermediate differential signal is provided to the first latch transistor 520(1) and the second latch transistor 520(2), which together are referred to herein as a first cross-coupled latch. The first intermediate differential signal is also provided to the first current mirror transistor 522(1), the third current mirror transistor 522(3), and the fourth current mirror transistor 522(4) (together, a first current mirror), which generate a first current mirror signal in response. The first intermediate differential signal is also provided to the second current mirror transistor 522(2), the fifth current mirror transistor 522(5), and the sixth current mirror transistor 522(6) (together, a second current mirror), which generate a second current mirror signal in response. The first current mirror signal and second current mirror signal together are called a second intermediate differential signal. This second intermediate differential signal drives the second cross-coupled latch. The second intermediate differential signal also drives the first pair of current mirror sinks as well as the second pair of current mirror sinks.

When the input signal has a logical high value, the second differential pair transistor 512(2) (and thus the second differential pair line 518(2)) passes $I_{SOURCE}$, and the first differential pair transistor 512(1) passes no current.

As described above, when the input signal is a logical high, the first differential pair line 518(1) passes no current, and the second differential pair line 518(2) passes $I_{SOURCE}$. Because the second differential pair line 518(2) is pulled up towards the positive power supply voltage in the first power supply voltage domain, the first latch transistor 520(1) is activated and passes current into the negative power supply voltage of the second power supply voltage domain. Passing this current causes the voltage at the drain of the first latch transistor 520(1) to be pulled down towards the negative power supply voltage of the second power supply voltage domain, which deactivates the second latch transistor 520(2). Additionally, the voltage at the drain of the second latch transistor 520(2), which is pulled up towards the positive power supply voltage of the first power supply voltage domain, acts on the gates of the fifth current mirror transistor 522(5) and the sixth current mirror transistor 522(6) to mirror the current flowing through the second current mirror transistor 522(2). Because the sixth current mirror transistor 522(6) is activated, the input of the fifth inverter 510(5) is low, which causes the input of the sixth inverter 510(6) to be high, which causes the inverted output node 526(2) to be low. The voltage at the inverted output node 526(2) is modulated with respect to the first power supply voltage domain because the sixth inverter 510(6) is powered by the positive and negative power supply voltages of the second power supply voltage domain.

The cascode transistor 514(1) protects the first differential pair transistor 512(1) from the low negative power supply voltage of the second power supply voltage domain and serves to keep the voltage at the drain of the first differential pair transistor 512(1) relatively constant, which keeps the switching threshold of the first differential pair transistor 512(1) constant and prevents jitter caused by modulation. Similarly, the cascode transistor 514(2) protects the second differential pair transistor 512(2) from the low negative power supply voltage of the second power supply voltage domain and serves to keep the voltage at the drain of the second differential pair transistor 512(2) relatively constant, which keeps the switching threshold of the second differential pair transistor 512(2) constant and prevents jitter caused by modulation.

Because the source of the fifth current mirror transistor 522(5) is pulled down towards the negative power supply voltage of the second power supply voltage domain, the third latch transistor 520(3) and the ninth current mirror transistor 522(9) are activated and pass $I_{SOURCE}$. Activating third latch transistor 520(3) causes the gate of tenth current mirror transistor 522(10) and the fourth latch transistor 520(4) to be pulled high, which deactivates these transistors. Also, because the source of the fifth current mirror transistor 522(5) is pulled down towards the negative power supply voltage of the second power supply voltage domain, the eighth current mirror transistor 522(8) is activated, which, through the third inverter 510(3) and fourth inverter 510(4), cause positive output node 526(1) to be a logical high.

As with circuit 400, in circuit 500, the first latch transistor 520(1) and second latch transistor 520(2), as well as the third latch transistor 520(3) and fourth latch transistor 520(4) provide feedback that improves the speed at which the output is changed from a high to a low or vice versa. The first resistor 524(1) and second resistor 524(2) also provide feedback that helps in this manner.

When the input signal is a logical low, the second conversion circuit 504 operates in an inverse manner. Thus, the first differential pair transistor 512(1) passes $I_{SOURCE}$, which causes second latch transistor 520(2), fourth current mirror transistor 522(4), third current mirror transistor 522(3), and first current mirror transistor 522(1) to be activated. Fourth current mirror transistor 522(4) causes the input of third inverter 510(3) to be low, which causes the input of the fourth inverter 510(4) to be high, which causes positive output node 526(1) to be low. Further, because third current mirror transistor 522(3) is activated, seventh current mirror transistor 522(7) and fourth latch transistor 520(4) are also activated, as is tenth current mirror transistor 522(10). Activating tenth current mirror transistor 522(10) pulls the input of fifth inverter 510(5) up, which pulls the input of sixth inverter 510(6) down, which causes inverted output node 526(2) to be a logical high.

Figure 6:
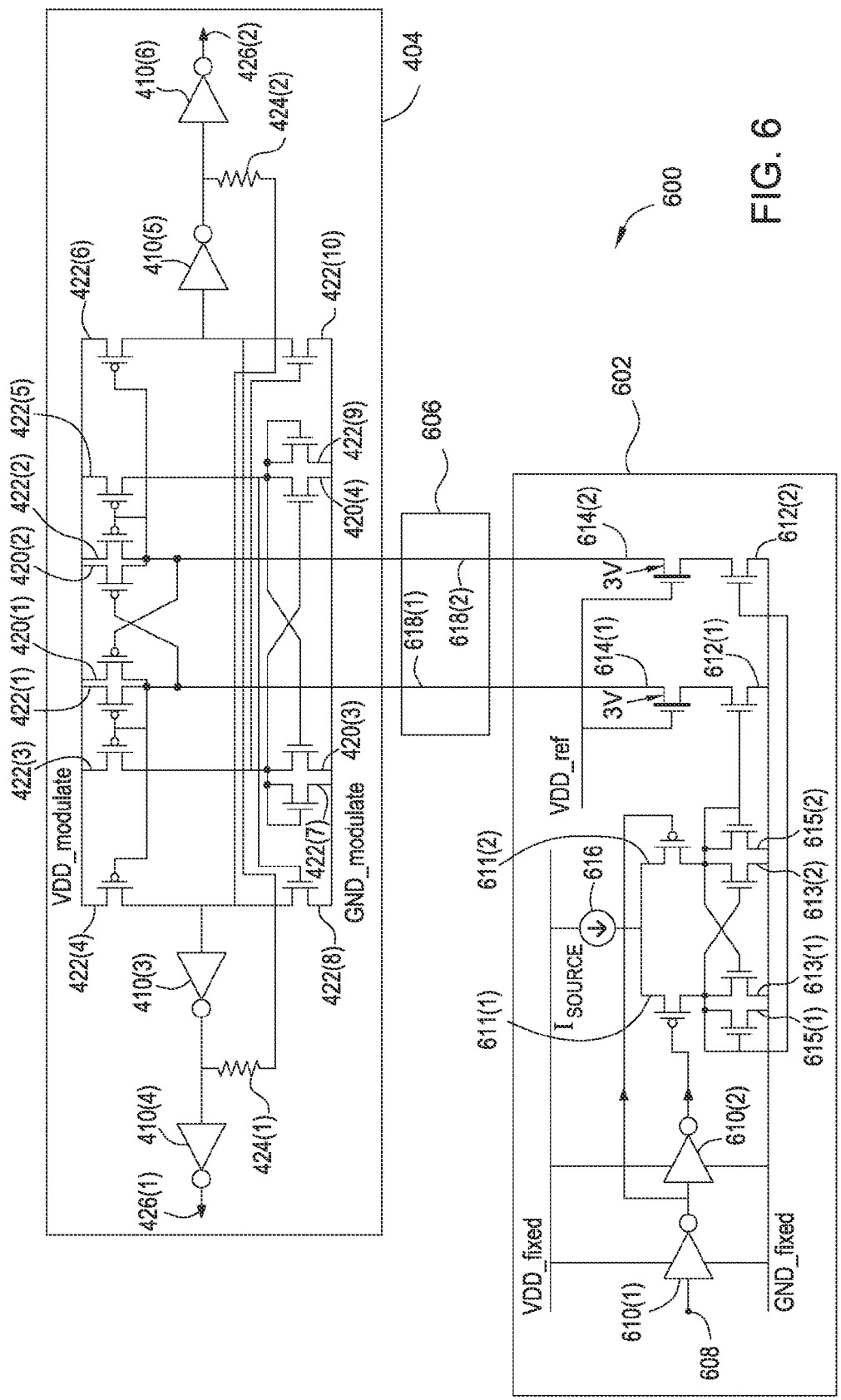

FIG. 6 illustrates a cross-domain interface circuit 600 for use in the cross-domain interface unit 314 of FIG. 3, according to another embodiment. The cross-domain interface circuit 600 includes a first conversion circuit 602 that is coupled to a second conversion circuit 404 via a differential pair 606. The input node 608 in the first conversion circuit 602 is coupled to an input line 316 of a power supply voltage domain 310. The second conversion circuit 404 is the second conversion circuit 404 of FIG. 4. However, the first conversion circuit 602 is different from the first conversion circuit 402 of FIG. 4.

More specifically, the first conversion circuit 602 has a first inverter 610(1), a second inverter 610, a first current source transistor 611(1), a second current source transistor 611(2), a first latch transistor 613(1), a second latch transistor 613(2), a first current mirror transistor 615(1), a second current mirror transistor 615(2), a first differential pair transistor 612(1), a second differential pair transistor 612(2), a first cascode transistor 614(1), and a second cascode transistor 614(2).

The input of the first inverter 610(1) is coupled to input node 608. The output of the first inverter 610(1) is coupled to the input of the second inverter 610(2) and to the gate of the second current source transistor 611(2). The output of the second inverter 610(2) is coupled to the gate of the first current source transistor 611(1). The controlled-current source 616 is coupled to the positive power supply voltage of the first power supply voltage domain and to the sources of the first current source transistor 611(1) and the second current source transistor 611(2). The drain of the first current source transistor 611(1) is coupled to the gates of the first current mirror transistor 615(1), the second differential pair transistor 612(2), and the second latch transistor 613(2) and to the drains of the first current mirror transistor 615(1) and the first latch transistor 613(1). The drain of the second current source transistor 611(2) is coupled to the gates of the first latch transistor 613(1), the second current mirror transistor 615(2), and the first differential pair transistor 612(1), and to the drains of the second latch transistor 613(2) and the second current mirror transistor 615(2). The sources of the first latch transistor 613(1), the second latch transistor 613(2), the first current mirror transistor 615(1), the second current mirror transistor 615(2), the first differential pair transistor 612(1), and the second differential pair transistor 612(2) are all coupled to the negative power supply voltage of the power supply voltage domain that the first conversion circuit 602 is in. The gates of the first cascode transistor 614(1) and the second cascode transistor 614(2) are coupled to reference voltage $V_{REF}$. The drains of the first differential pair transistor 612(1) and the second differential pair transistor 612(2) will not exceed the reference voltage $V_{REF}$. Thus, $V_{REF}$ is set to limit these drain voltages to values that are safe for first differential pair transistor 612(1) and the second differential pair transistor 612(2). The reference voltage $V_{REF}$ is set such that drain voltage of first differential pair transistor 612(1) and drain voltage of second differential pair transistor 612(2) do not substantially degrade the device reliability of the first differential pair transistor 612(1) and the second differential pair transistor 612(2). The reference voltage $V_{REF}$ is also set such that the first differential pair transistor 612(1) and the second differential pair transistor 612(2) both operate within the saturation region regardless of the voltage differential between the two power supply domains due to modulation, in order to minimize timing variations. The first cascode transistor 614(1) and the second cascode transistor 614(2) are thick-oxide devices, so that they can withstand higher gate to drain voltages. In one embodiment, the reference voltage $V_{REF}$ is set to 3V above GND_FIXED. The source of the first cascode transistor 614(1) is coupled to the drain of the first differential pair transistor 612(1) and the source of the second cascode transistor 614(2) is coupled to the drain of the second differential pair transistor 612(2). The drain of the first cascode transistor 614(1) is coupled to the first differential pair line 618(1) and the drain of the second cascode transistor 614(2) is coupled to the second differential pair line 618(2).

In operation, an input signal applied to input node 608 is logically inverted by first inverter 610(1) to form an inverted signal, which is inverted again by second inverter 610(2) to form an uninverted signal. The inverted signal is applied to the gate of the first current source transistor 611(1), and the uninverted signal is applied to the gate of the second current source transistor 612(2). When the input signal is a logical high, the second current source transistor 611(2) passes current $I_{SOURCE}$ and the first current source transistor 611(1) passes no current. When the input signal is a logical low, the second current source transistor 611(2) passes no current and the first current source transistor 611(1) passes current $I_{SOURCE}$. The first latch transistor 613(1) pulls its drain to GND_fixed when the second current source transistor 611(2) passes $I_{SOURCE}$, and the second latch transistor 613(2) pulls its drain to GND_fixed when the first current source transistor 611(1) passes $I_{SOURCE}$. First current mirror transistor 615(1) passes $I_{SOURCE}$ when first current source transistor 611(1) passes $I_{SOURCE}$ and second current mirror transistor 615(2) passes $I_{SOURCE}$ when second current source transistor 611(2) passes $I_{SOURCE}$. Further, the current through first differential pair transistor 612(1) mirrors the current through second current mirror transistor 615(2) and the current through second differential pair transistor 612(2) mirrors the current through first current mirror transistor 615(1). Thus, when input node 608 is a logical high, first differential pair transistor 612(1) passes $I_{SOURCE}$ and when input node 608 is a logical low, second differential pair transistor 612(2) passes $I_{SOURCE}$. The differential pair 606 transmits signals to the second conversion circuit 404, which responds as described above with respect to FIG. 4. The circuit 600 described with respect to FIG. 6 provides first differential pair transistor 612(1) and second differential pair transistor 612(2) with better headroom as compared with the first differential pair transistor 412(1) and second differential pair transistor 412(2) of FIG. 4.

In any of the embodiments described in FIGS. 4-6, the simple current mirrors may be replaced by other types of current mirrors (such as a super mirror, a Wilson mirror or the like).

Figure 7:
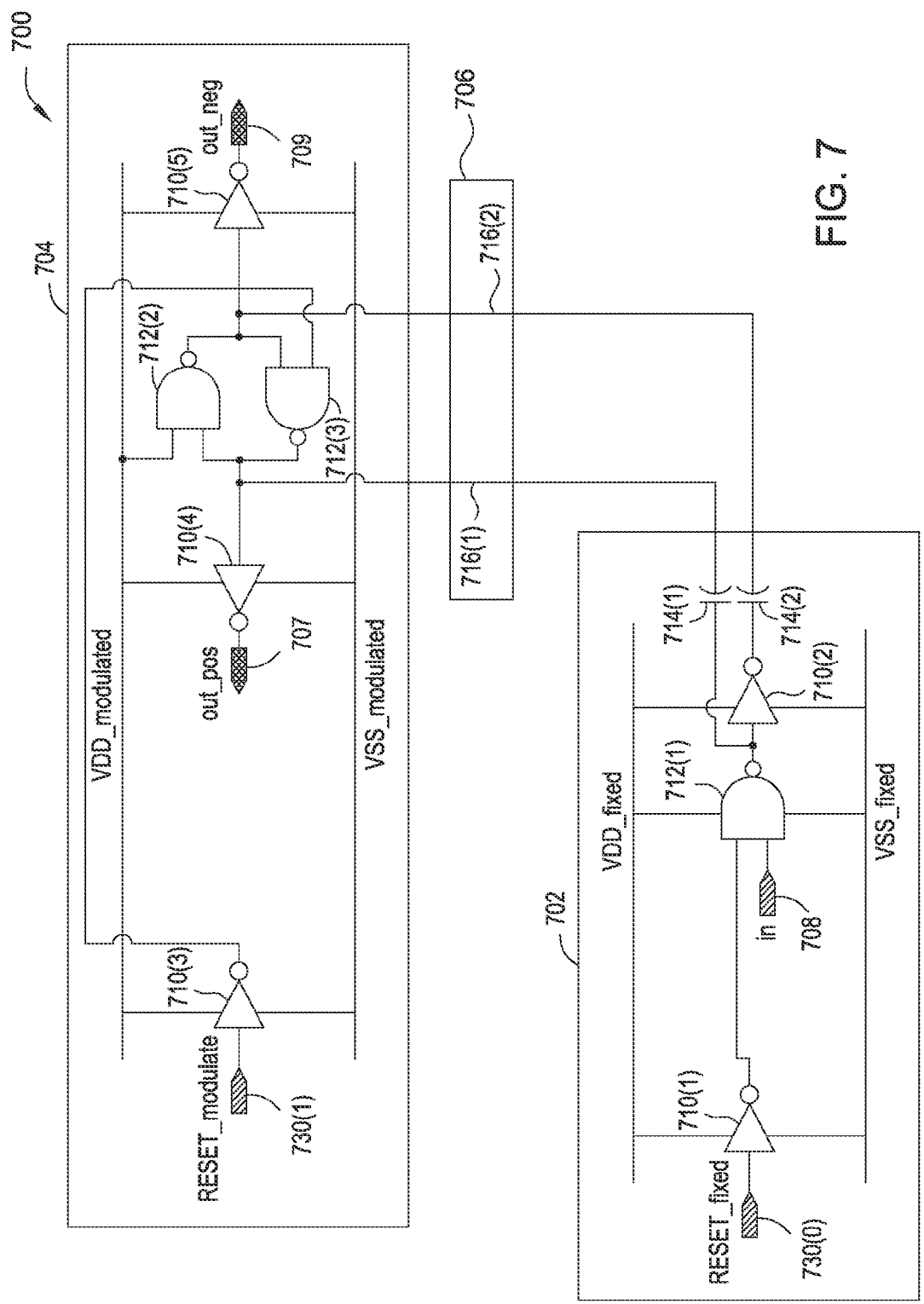

FIG. 7 illustrates a cross-domain interface circuit 700 for use in the cross-domain interface unit 314 of FIG. 3, according to another embodiment. The cross-domain interface circuit 700 includes a first conversion circuit 702 that is coupled to a second conversion circuit 704 via a connection line 706. The input node 708 in the first conversion circuit 702 is coupled to an input line 316 of a first power supply voltage domain 310. A positive output node 707 is coupled to a positive output line 318 in a second different power supply voltage domain 310 and a negative output node 709 is coupled to a negative output line 320 in the second power supply voltage domain 310. A first reset signal is input to first reset node 730(0) and a second reset signal is input to second reset node 730(1). The first conversion circuit 702 is within the first power supply voltage domain 310 and the second conversion circuit 704 is within the second power supply voltage domain 310.

The first conversion circuit 702 includes a first inverter 710(1), a second inverter 710(2), a first NAND gate 712(1), a first alternating-current coupling (AC-coupling) 714(1), and a second AC-coupling 714(2). The connection line 706 includes a first AC-coupling line 716(1) and a second AC-coupling line 716(2). The second conversion circuit 704 includes a third inverter 710(3), a fourth inverter 710(4), a fifth inverter 710(5), a second NAND gate 712(2), and a third NAND gate 712(3).

In the first conversion circuit 702, the input of first inverter 710(1) is coupled to the first reset node 730(0). The output of the first inverter 710(1) is coupled to a first input of the first NAND gate 712(1). The input node 708 is coupled to a second input of the first NAND gate 712(1). The output of the first NAND gate 712(1) is coupled to the first AC-coupling 714(1) and to the input of the second inverter 710(2). The output of the second inverter 710(2) is coupled to the second AC-coupling 714(2).

In the second conversion circuit 704, the reset signal 730(1) is coupled to the input of the third inverter 710(3). The output of the third inverter 710(3) is coupled to the second input of the third NAND gate 712(3). The modulated power supply VDD_MODULATED is coupled to a first input of the second NAND gate 712(2). The second input of the second NAND gate 712(2) is coupled to the input of the fourth inverter 710(4). The first input of the third NAND gate 712(3) is coupled to the input of the fifth inverter 710(5). The output of the fourth inverter 710(4) is coupled to the first (positive) output node 707 and the output of the fifth inverter 710(5) is coupled to the second (negative) output node 709. The first AC-coupling 714(1) is coupled, through the first AC-coupling line 716(1), to the second conversion circuit 704 and the second AC-coupling 714(2) is coupled, through the second AC-coupling line 716(2), to the second conversion circuit 704. More specifically, the first AC-coupling 714(1) is coupled to the input of the fourth inverter 710(4), and to a second input of the second NAND gate 712(2), which is coupled to the output of the third NAND gate 712(3). The second AC-coupling 714(2) is coupled to a first input of the third NAND gate 712(3), and to the input of the fifth inverter 710(5), which is coupled to the output of the second NAND gate 712(2).

Within the first conversion circuit 702, each element is powered by VDD_FIXED and VSS_FIXED, which are fixed power supply and fixed ground signals, respectively. Within the second conversion circuit 704, each element is powered by VDD_MODULATED and VSS_MODULATED, which are modulated power supply and modulated ground signals, respectively. The modulated power supply signal VDD_MODULATED is modulated with respect to the fixed power supply signal VDD_FIXED. Similarly, the modulated ground signal VSS_MODULATED is modulated with respect to the fixed ground signal VSS_FIXED. It should be understood that the "modulated domain," which is the domain powered by VDD_MODULATED and VSS_MODULATED, corresponding to second conversion circuit 704, could have voltages that either remain lower than or remain higher than the voltages of the "fixed domain," which is the domain powered by VDD_FIXED and VSS_FIXED. In either case, the "modulated domain" is described herein as being modulated with respect to the fixed domain. This modulation may be applied to shift the modulated domain either up or down.

The second NAND gate 712(2) and third NAND gate 712(3) together constitute a cross-coupled latch. In normal operation—i.e., when the cross-domain interface circuit 700 is not being reset—both the first reset signal 730(0) and the second reset signal 730(1) are low. With the first reset signal 730(0) low, the first input of the first NAND gate 712(1) is high. With the second reset signal 730(1) low, the output of the third inverter 710(3) is high, meaning that the second input of the third NAND gate 712(3) is high. Further, because the first input of second NAND gate 712(2) is coupled to VDD_MODULATED, that first input is a logical high. As is clear, when no reset signals are asserted, at least one input of each NAND gate 712 is high, meaning that the output of the NAND gate 712 is the logical inverse of the logical value of the other input to that NAND gate 712.

The following discussion presumes that both the first reset signal 730(0) and the second reset signal 730(1) are low. Operation when either reset signal 730 is high will be discussed afterwards.

With the first reset signal 730(0) low, when the input node 708 switches from a Magical low to a logical high, the output of the first NAND gate 712(1) switches from a logical high to a logical low and current is drawn through the first AC-coupling 714(1). Also, the output of the second inverter 710(2) switches from a logical low to a logical high and current is pushed through second AC-coupling 714(2).

Drawing current through first AC-coupling 714(1) causes the input of the fourth inverter 710(4) to be a logical low, which causes positive output 707 to be high, Additionally, the output of the second NAND gate 712(2) is high, which causes the negative output to be low and causes the first input of the third NAND gate 712(3) to be high, which causes the output of the third NAND gate 712(3) to be low, reinforcing the input from the first conversion circuit 702.

When the input node 708 switches from logical high to a logical low, the logical inverse of the process described above occurs. Thus, when the input node 708 switches to a logical low, the positive output 707 is a logical low and the negative output 709 is a logical high.

Asserting (switching to logical high) either of the reset signals 730 causes the cross-domain interface circuit 700 to be reset (i.e., the cross-coupled latch stores a value that causes positive output 707 to be logical low and the negative output to be high 709. More specifically, when the first reset signal 730(0) is asserted, the first input of the first NAND gate 712(1) is low, which means that the output of the first NAND gate 712(1) is high regardless of the value at the input node 708. Thus, the cross-domain interface circuit 700 behaves as if the input node 708 were a logical low, as described above (i.e., the above-described signals pass through the AC-couplings 714 to set the cross-coupled latch and output nodes to the above-mentioned values). With the second reset signal 730(1) asserted, the second input of the third NAND gate 712(3) is low, meaning that the output of the third NAND gate 712(3) is high, which causes the positive output 707 to be low and the negative output to be high.

The cross-domain interface circuit 700 can be operated wherein the fixed power supply and ground signals that power the first conversion circuit 702 remain below or relatively equal to the modulated power supply and ground signals that power the second conversion circuit 704. In such a shift-up situation, it is beneficial to assert the first reset signal 730(0) in the first conversion circuit 702 without the second reset signal 730(1) first being asserted. This qualification is beneficial because when the first reset signal 730(0) is asserted, the first NAND gate 712(1) and the second inverter 710(2) cause the first differential pair line 716(1) to go to VDD_MODULATED and the second differential pair line 716(2) to go to VSS_MODULATED. Now, by asserting the second reset signal 730(1) some time after the first reset signal 730(0) has been asserted, since the first differential pair line 716(1) is already high and second differential pair line 716(2) is already low, the action of asserting the second reset signal 730(1) does not generate overstress in the transistors that comprise the second conversion circuit 704. However, if the second reset signal 730(1) is asserted when the first reset signal 730(0) is not asserted, then overstress on those transistors may occur. More specifically, if the first differential pair line 716(1) is at VSS_MODULATED and second differential pair line 716(2) is at VDD_MODULATED, then when the second reset signal 730(1) is asserted, a negative pulse would be generated on the second differential pair line 716(2) which may cause stress on the transistors of the second conversion circuit 704. Thus, the first reset signal 730(0) should be asserted before the second reset signal 730(1) is asserted. Additionally, the second reset signal 730(1) should be deasserted before the first reset signal 730(0) is deasserted.

For similar reasons, when the fixed power supply VDD_FIXED and fixed ground signal VSS_FIXED remain above or relatively equal to the modulated power supply VDD_MODULATED and modulated ground signal VSS_MODULATED, the first reset signal 730(0) should be asserted before the second reset signal 730(1) is asserted. In addition, the second reset signal 730(1) should be deasserted before the first reset signal 730(0) is deasserted. In this "shift-down" situation, the modulated VSS_MODULATED and VDD_MODULATED are considered to be modulated with respect to VSS_FIXED and VDD_FIXED, but VSS_FIXED and VDD_FIXED remain above or relatively equal to VSS_MODULATED and VDD_MODULATED. Thus, regardless of whether the circuit is used to "shift up" or is used to "shift down," the second reset signal should not be asserted unless the first reset signal is already asserted, and the first reset signal should not be deasserted unless the second reset signal is already deasserted.

Figure 8:
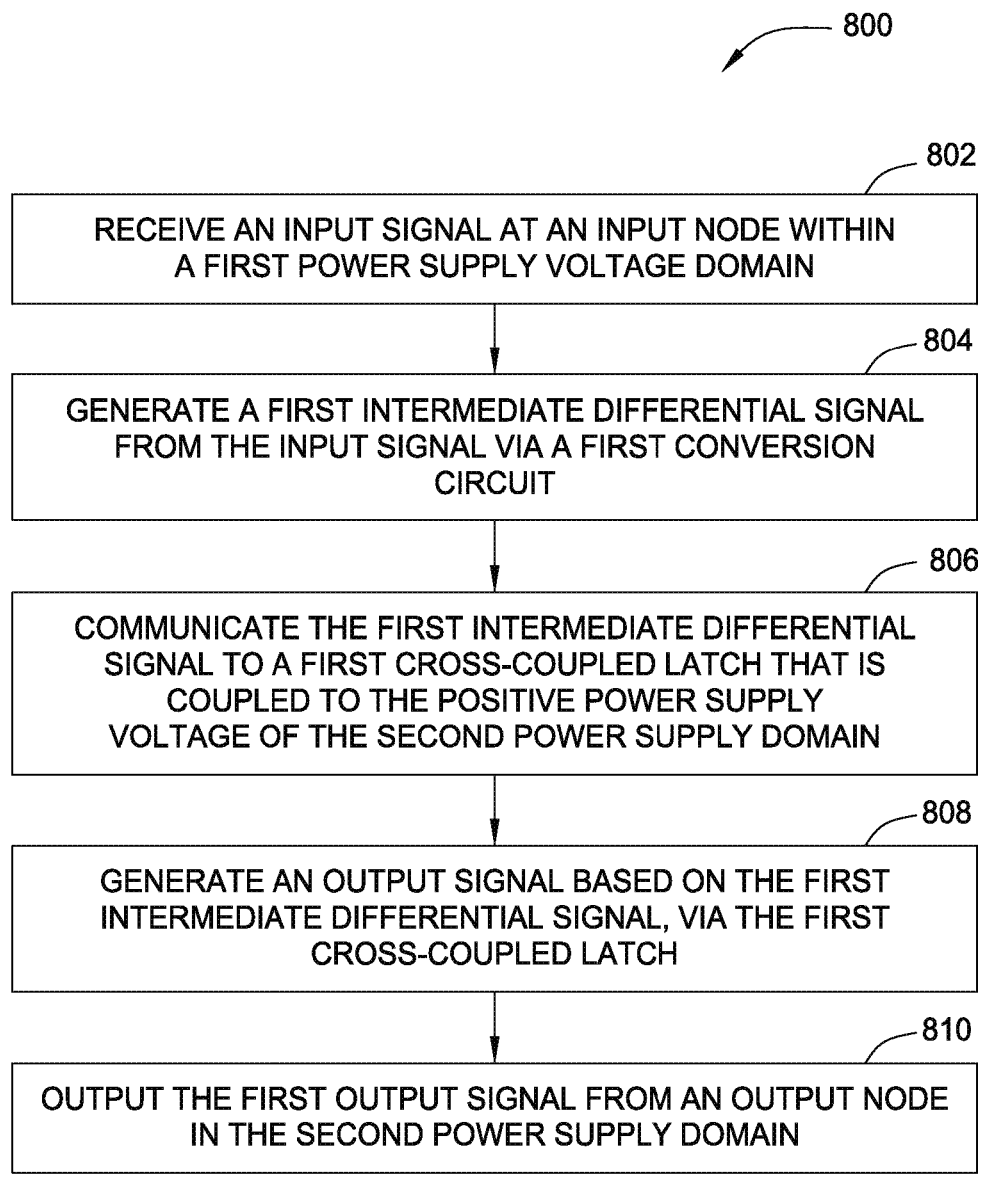
FIG. 8 illustrates a method for converting data signals from one power supply voltage domain for use in another power supply voltage domain, according to one embodiment described herein.

FIG. 8 illustrates a method for transmitting a data signal from a first power supply voltage domain to a second power supply voltage domain, according to an embodiment. Although the method steps are described in conjunction with FIGS. 1-7, persons skilled in the art will understand that any system configured to perform the method steps, in any order, falls within the scope of the present invention.

As shown, a method 800 begins at step 802, where an input node in a first conversion circuit (first conversion circuit 402, first conversion circuit 502, first conversion circuit 602, or first conversion circuit 702) within a first power supply voltage domain 310 receives an input signal.

At step 804, the first conversion circuit generates a first intermediate differential signal. At step 806, the first conversion circuit transmits the first intermediate differential signal to a first cross-coupled latch within the second conversion circuit (second conversion circuit 404, second conversion circuit 504, second conversion circuit 604, or second conversion circuit 704), which is within a second power supply voltage domain and is coupled to the positive power supply voltage of the second power supply voltage domain. At step 808, the first cross-coupled latch generates an output signal based on the first intermediate differential signal. Finally, at step 810, the second conversion circuit outputs the output signal from an output node in the second power supply voltage domain.

CONCLUSION

Various embodiments of the present technology provide input devices and methods for reducing parasitic capacitance in a capacitive sensing input device. Particularly, embodiments described herein advantageously utilize a modulated power supply to modulate signals within an input device to reduce the effects of parasitic capacitances experienced by sensor electrodes in the input device. Additionally, some other embodiments provide a display device with touch sensing capabilities that includes a modulated power supply to modulate signals provided to display elements and touch sensing elements within the display device. With a modulated power supply, effects of capacitive coupling between sensor electrodes and other components of the input device is reduced, thereby increasing the ability to sense input objects.

Thus, the embodiments and examples set forth herein were presented in order to best explain the embodiments in accordance with the present technology and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

In view of the foregoing, the scope of the present disclosure is determined by the claims that follow.

What is claimed is:

1. A method for communicating a data signal within an integrated circuit of a processing system having a first power supply voltage domain and a second power supply voltage domain, wherein at least one of a positive power supply voltage of the second power supply voltage domain and a negative power supply voltage of the second power supply voltage domain are modulated with respect to the first power supply voltage domain, the method comprising:
   receiving the data signal at a first node of the integrated circuit, wherein the first node is within the first power supply voltage domain;
   generating a first intermediate differential signal from the data signal via a first conversion circuit of the integrated circuit;
   communicating the first intermediate differential signal to a first cross-coupled latch, wherein the first cross-coupled latch generates a first output signal based on the first intermediate differential signal; and
   outputting the first output signal from a second node of the integrated circuit, wherein the second node is in the second power supply voltage domain, wherein generating the first intermediate differential signal comprises:
   removing effects corresponding to modulation in at least one of the positive power supply voltage of the second power supply voltage domain and the negative power supply voltage of the second power supply voltage domain.

2. The method of claim 1, wherein communicating the first intermediate differential signal to the first cross-coupled latch comprises communicating the first intermediate differential signal to the first cross-coupled latch that is coupled to the positive power supply voltage of the second power supply voltage domain.

3. The method of claim 2, wherein:
   the positive power supply voltage of the second power supply voltage domain does not drop below the positive power supply voltage of the first power supply voltage domain; and
   the negative power supply voltage of the second power supply voltage domain does not drop below the negative power supply voltage of the first power supply voltage domain.

4. The method of claim 1, wherein communicating the first intermediate differential signal to the first cross-coupled latch comprises communicating the first intermediate differential signal to the first cross-coupled latch that is coupled to the negative power supply voltage of the second power supply voltage domain.

5. The method of claim 4, wherein:
   the positive power supply voltage of the second power supply voltage domain does not rise above the positive power supply voltage of the first power supply voltage domain; and
   the negative power supply voltage of the second power supply voltage domain does not rise above the negative power supply voltage of the first power supply voltage domain.

6. The method of claim 1, wherein:
   generating the first intermediate differential signal from the data signal comprises transmitting the data signal through a pair of alternating-current couplings to generate the first intermediate differential signal.

7. The method of claim 1, wherein removing effects corresponding to at least one of the positive power supply voltage of the second power supply voltage domain and the negative power supply voltage of the second power supply voltage domain comprises:
   communicating the data signal through a pair of cascode transistors coupled in series with a differential pair to generate the first intermediate differential signal.

8. A method for communicating a data signal within an integrated circuit of a processing system having a first power supply voltage domain and a second power supply voltage domain, wherein at least one of a positive power supply voltage of the second power supply voltage domain and a negative power supply voltage of the second power supply voltage domain are modulated with respect to the first power supply voltage domain, the method comprising:
receiving the data signal at a first node of the integrated circuit, wherein the first node is within the first power supply voltage domain;
generating a first intermediate differential signal from the data signal via a first conversion circuit of the integrated circuit;
communicating the first intermediate differential signal to a first cross-coupled latch, wherein the first cross-coupled latch generates a first output signal based on the first intermediate differential signal; and
outputting the first output signal from a second node of the integrated circuit, wherein the second node is in the second power supply voltage domain, wherein communicating the first intermediate differential signal to the first cross-coupled latch further comprises:
communicating the first intermediate differential signal to a first current mirror configured to generate a first current mirror signal based on the first intermediate differential signal; and
generating the first output signal based on the first current mirror signal.

9. The method of claim 8, wherein communicating the first intermediate differential signal to the first cross-coupled latch further comprises:
communicating the first intermediate differential signal to a second current mirror configured to generate a second current mirror signal based on the first intermediate differential signal, wherein the second current mirror signal is a logical inverse of the first current mirror signal; and
communicating the first current mirror signal to a first inverter having a first output that is coupled, through a first resistor, to the second current mirror signal.

10. An integrated circuit comprising:
a first power supply voltage domain;
a second power supply voltage domain, wherein at least one of a positive power supply voltage of the second power supply voltage domain and a negative power supply voltage of the second power supply voltage domain are modulated with respect to the first power supply voltage domain; and
a cross-domain interface circuit, comprising:
a first conversion circuit that includes a first node and that is within the first power supply voltage domain, and
a second conversion circuit that is within the second power supply voltage domain and that includes a second node and a first cross-coupled latch,
wherein the first conversion circuit is configured to receive a data signal at the first node, generate a first intermediate differential signal from the data signal, and communicate the first intermediate differential signal to the second conversion circuit; and
wherein the second conversion circuit is configured to receive the first intermediate differential signal at the first cross-coupled latch, generate a first output signal based on the first intermediate differential signal via the first cross-coupled latch, and output the first output signal from the second node, wherein:
the second conversion circuit includes a first current mirror configured to generate a first current mirror signal based on the first intermediate differential signal, and
the second conversion circuit is configured to generate the first output signal based on the first current mirror signal.

11. The integrated circuit of claim 10, wherein:
the first cross-coupled latch is coupled to a positive power supply voltage of the second power supply voltage domain.

12. The integrated circuit of claim 11, wherein:
the positive power supply voltage of the second power supply voltage domain does not drop below the positive power supply voltage of the first power supply voltage domain; and
the negative power supply voltage of the second power supply voltage domain does not drop below the negative power supply voltage of the first power supply voltage domain.

13. The integrated circuit of claim 10, wherein:
the first cross-coupled latch is coupled to a negative power supply voltage of the second power supply voltage domain.

14. The integrated circuit of claim 13, wherein:
the positive power supply voltage of the second power supply voltage domain does not rise above a positive power supply voltage of the first power supply voltage domain; and
the negative power supply voltage of the second power supply voltage domain does not rise above the negative power supply voltage of the first power supply voltage domain.

15. The integrated circuit of claim 10, wherein:
the first conversion circuit includes a pair of cascode transistors configured to receive the data signal and coupled in series with a differential pair to generate the first intermediate differential signal.

16. The integrated circuit of claim 10, wherein:
the second conversion circuit further includes:
a second current mirror configured to generate a second current mirror signal based on the first intermediate differential signal, wherein the second current mirror signal is a logical inverse of the first current mirror signal,
a first resistor, and
a first inverter having an output coupled to the first resistor and an input configured to receive the first current mirror signal,
wherein the first resistor is configured to receive the second current mirror signal.

17. An integrated circuit comprising:
a first power supply voltage domain;
a second power supply voltage domain, wherein at least one of a positive power supply voltage of the second power supply voltage domain and a negative power supply voltage of the second power supply voltage domain are modulated with respect to the first power supply voltage domain; and
a cross-domain interface circuit, comprising:
a first conversion circuit that includes a first node and that is within the first power supply voltage domain, and
a second conversion circuit that is within the second power supply voltage domain and that includes a second node and a first cross-coupled latch, wherein the first conversion circuit is configured to receive a data signal at the first node, generate a first intermediate differential signal from the data signal, and communicate the first intermediate differential signal to the second conversion circuit; and wherein the second conversion circuit is configured to receive the first intermediate differential signal at the first cross-coupled latch, generate a first output signal based on the first intermediate differential signal via the first cross-coupled latch, and output the first output signal from the second node, wherein:

the first conversion circuit further includes a pair of alternating-current couplings configured to generate the first intermediate differential signal based on the data signal.

18. The integrated circuit of claim 10, wherein the first conversion circuit further comprises:
a controlled-current source; and
a differential pair of transistors,
wherein a source of each of the differential pair of transistors is coupled to the negative power supply voltage of the first power supply voltage domain through the controlled-current source.

19. An integrated circuit comprising:
a first power supply voltage domain;
a second power supply voltage domain, wherein at least one of a positive power supply voltage of the second power supply voltage domain and a negative power supply voltage of the second power supply voltage domain are modulated with respect to the first power supply voltage domain; and
a cross-domain interface circuit, comprising:
a first conversion circuit that includes a first node and that is within the first power supply voltage domain, and
a second conversion circuit that is within the second power supply voltage domain and that includes a second node and a first cross-coupled latch,
wherein the first conversion circuit is configured to receive a data signal at the first node, generate a first intermediate differential signal from the data signal, and communicate the first intermediate differential signal to the second conversion circuit; and
wherein the second conversion circuit is configured to receive the first intermediate differential signal at the first cross-coupled latch, generate a first output signal based on the first intermediate differential signal via the first cross-coupled latch, and output the first output signal from the second node, wherein the first intermediate differential signal is in the first power supply voltage domain and wherein the first intermediate differential signal is converted into a second intermediate differential signal in the second power supply voltage domain by the first cross-coupled latch.

20. The integrated circuit of claim 19, wherein the second conversion circuit further comprises:
a first differential current source configured to receive the second intermediate differential signal;
a first pair of current mirror sources coupled in parallel with the first differential current source, wherein the first differential current source is configured to cause the first pair of current mirror sources to conduct a first current mirror signal;
a first pair of current mirror sinks configured to sink current to the negative power supply voltage of the second power supply voltage domain;

a second cross-coupled latch that is coupled to the negative power supply voltage of the second power supply voltage domain,
wherein the first pair of current mirror sources is configured to drive the second cross-coupled latch and the first pair of current mirror sinks.

21. The integrated circuit of claim 20, wherein the second conversion circuit further comprises:
a first pair of buffering inverters coupled to a positive output node,
wherein both the first pair of current mirror sources and the first pair of current mirror sinks are coupled to the first pair of buffering inverters.

22. The integrated circuit of claim 21, wherein the second conversion circuit further comprises:
a second differential current source configured to receive the second intermediate differential signal;
a second pair of current mirror sources coupled in parallel with the second differential current source, wherein the second differential current source is configured to cause the second pair of current mirror sources to conduct a second current mirror signal;
a second pair of current mirror sinks configured to sink current to the negative power supply voltage of the second power supply voltage domain,
wherein the second pair of current mirror sources is configured to drive the second cross-coupled latch and the second pair of current mirror sinks.

23. The integrated circuit of claim 22, wherein the second conversion circuit further comprises:
a second pair of buffering inverters coupled to a negative output node,
wherein both the second pair of current mirror sources and the second pair of current mirror sinks are coupled to the second pair of buffering inverters.

24. The integrated circuit of claim 23, wherein:
the first pair of buffering inverters is cross-coupled to the second pair of buffering inverters with a pair of resistors.

25. The integrated circuit of claim 19, wherein the second conversion circuit further comprises:
a first differential current sink configured to receive the second intermediate differential signal;
a first pair of current mirror sinks coupled in parallel with the first differential current sink, wherein the first differential current sink is configured to cause the first pair of current mirror sinks to conduct a first current mirror signal;
a first pair of current mirror sources configured to source current from the positive power supply voltage of the second power supply voltage domain;
a second cross-coupled latch that is coupled to the positive power supply voltage of the second power supply voltage domain,
wherein the first pair of current mirror sinks is configured to drive the second cross-coupled latch and the first pair of current mirror sources.

26. The integrated circuit of claim 25, wherein the second conversion circuit further comprises:
a first pair of buffering inverters coupled to a positive output node,
wherein both the first pair of current mirror sources and the first pair of current mirror sinks are coupled to the first pair of buffering inverters.

27. The integrated circuit of claim 26, wherein the second conversion circuit further comprises:

a second differential current sink configured to receive the second intermediate differential signal;

a second pair of current mirror sinks coupled in parallel with the second differential current sink, wherein the second differential current sink is configured to cause the second pair of current mirror sinks to conduct a second current mirror signal;

a second pair of current mirror sources configured to source current from the positive power supply voltage of the second power supply voltage domain, wherein the second pair of current mirror sinks is configured to drive the second cross-coupled latch and the second pair of current mirror sources.

28. The integrated circuit of claim 27, wherein the second conversion circuit further comprises:

a second pair of buffering inverters coupled to a negative output node, wherein both the second pair of current mirror sources and the second pair of current mirror sinks are coupled to the second pair of buffering inverters.

29. The integrated circuit of claim 28, wherein:

the first pair of buffering inverters is cross-coupled to the second pair of buffering inverters with a pair of resistors.

30. An input device, comprising:

a plurality of sensor electrodes; and a processing system configured to drive the plurality of sensor electrodes for capacitive sensing, the processing system including an integrated circuit comprising:

a first power supply voltage domain;

a second power supply voltage domain, wherein at least one of a positive power supply voltage of the second power supply voltage domain and a negative power supply voltage of the second power supply voltage domain are modulated with respect to the first power supply voltage domain; and a cross-domain interface circuit, comprising:

a first conversion circuit that includes a first node and that is within the first power supply voltage domain, and a second conversion circuit that is within the second power supply voltage domain and that includes a second node and a first cross-coupled latch, wherein the first conversion circuit is configured to receive a data signal at the first node, generate a first intermediate differential signal from the data signal, and communicate the first intermediate differential signal to the second conversion circuit; and wherein the second conversion circuit is configured to receive the first intermediate differential signal at the first cross-coupled latch, generate a first output signal based on the first intermediate differential signal via the first cross-coupled latch, and output the first output signal from the second node.

* * * * *